US006644238B2

(12) United States Patent
Watts et al.

(10) Patent No.: US 6,644,238 B2
(45) Date of Patent: *Nov. 11, 2003

(54) CONVEYORIZED VACUUM INJECTION SYSTEM

(75) Inventors: Hal Watts, Holden, MA (US); Jules Gordon, Methuen, MA (US); Walter Dziegel, Dracut, MA (US)

(73) Assignee: Speedline Technologies, Inc., Haverhill, MA (US)

( * ) Notice: Subject to any disclaimer, the term of this patent is extended or adjusted under 35 U.S.C. 154(b) by 5 days.

This patent is subject to a terminal disclaimer.

(21) Appl. No.: 09/728,175

(22) Filed: Dec. 1, 2000

(65) Prior Publication Data

US 2001/0013316 A1 Aug. 16, 2001

Related U.S. Application Data

(63) Continuation-in-part of application No. 09/493,873, filed on Jan. 28, 2000.

(51) Int. Cl.$^7$ .................... B05C 11/00; B29C 31/00
(52) U.S. Cl. ............... 118/45; 118/684; 264/102; 264/127.17; 425/110
(58) Field of Search ................... 118/45, 684, 668, 118/678–679; 264/102, 272.15, 272.17; 425/110; 438/126, 127; 101/416.1

(56) References Cited

U.S. PATENT DOCUMENTS 3,946,907 A    3/1976  Berve ................ 222/152
4,593,835 A    6/1986  Kikkawa et al. ........ 222/131
4,872,825 A *  10/1989 Ross .................. 425/117
5,480,487 A    1/1996  Figini et al. ......... 118/610
5,621,494 A *  4/1997  Kazumi et al. ......... 396/56
5,795,626 A *  8/1998  Gabel et al. .......... 427/458
5,817,545 A    10/1998 Wang et al. ........... 438/127
5,819,983 A    10/1998 White et al. ........... 222/1
6,000,924 A    12/1999 Wang et al. ........... 425/125
6,080,605 A    6/2000  Distefano et al. ...... 238/126

FOREIGN PATENT DOCUMENTS

WO        WO 99/56316       4/1999

OTHER PUBLICATIONS

V. Solberg, "Assembly Process Requirements For Chip–Scale and Chip–Size μBGA", Tessera, Inc.

* cited by examiner

Primary Examiner—Richard Crispino
Assistant Examiner—Yewebdar T Tadesse
(74) Attorney, Agent, or Firm—Mintz, Levin, Cohn, Ferris, Glovsky and Popeo, P.C.

(57) ABSTRACT

The present invention provides a method and apparatus for dispensing onto a substrate. In one embodiment, the apparatus includes an injector having an injecting outlet and an air inlet, a fixture for receiving a substrate in communication with the injecting outlet and the air inlet and having a gasket forming a seal around the injecting outlet and air inlet, and a sheet of substantially taut film disposed between the injector and a substrate placed in the receptacle of the fixture such that, when the injector is in a position for dispensing encapsulant to a process area on the substrate, at least the injectng tip and the inlet tip of the injector project through the substantially taut film to the process area.

22 Claims, 28 Drawing Sheets

CONVEYORIZED VACUUM INJECTION SYSTEM

RELATED APPLICATION

This application is related to U.S. Utility application Ser. No. 09/168,536, filed Oct. 10, 1998, which is incorporated by reference herein, and this application is a continuation in part of U.S. Utility application Ser. No. 09/493,873, filed Jan. 28, 2000, which also is incorporated by reference herein.

FIELD OF THE INVENTION

The present invention relates to an apparatus, process, and system for encapsulating electronic parts, and more specifically to an apparatus and process that uses changes in air pressure to force material under and around an electronic integrated circuit chip and that maintains a clean condition to both the chip and substrate during and after the process.

BACKGROUND OF THE INVENTION

The need for denser, larger and more durable chip assemblies has broadened the use of Direct Chip Attach (DCA) technology to include flip chip integrated circuits. A typical flip chip integrated circuit utilizes a solder ball grid array to provide electrical connections between a die of the flip chip and a substrate. During manufacturing of a typical flip chip, after the flip chip is assembled on a substrate, a liquid dispensing system is used to apply an underfill encapsulant material between the die and the substrate. The flip chip underfill material is used to reduce mechanical and thermal stress on the electrical connections and to protect the electrical connections against atmospheric conditions. The underfill material provides stability and rigidity to the assembled flip chip and may also be used as a heat conductor to improve thermal performance of the flip chip.

In typical prior art flip chip underfilling processes, a dispenser system is used to dispense underfill material around the sides of the flip chip and the underfill material spreads under the flip chip and around the solder balls of the grid array via capillary action or "wicking". During the assembly process, the substrate is typically heated prior to, during, and after dispensing of the underfill material to a temperature ranging from ambient conditions to approximately 120° C. The heating of the substrate increases the capillary action causing the underfill material to flow further under the die of the flip chip. A final fillet of underfill material is applied around the sides of the flip chip after the wicking action has occurred. A drawback associated with such underfilling processes is that the underfill material may not completely fill all voids between a die and a substrate in a flip chip. For example, the underfill material can fail to fill spaces between the contacts of a die.

To overcome the problem of voids or air gaps, one prior art dispensing system developed by Tessera of San Jose, Calif. utilizes a vacuum approach to completely underfill flip chips. In this prior art system, the dispensing system, including one or more flip chips that are to receive underfill material, is enclosed within an air tight chamber, and prior to the dispensing of underfill material, a vacuum pump is used to purge all air from the chamber to create a vacuum. The underfill material is then dispensed around all sides of the flip chips, and the chamber is returned to ambient pressure. When the chamber is returned to ambient air pressure, the underfill material is forced under the flip chips by the difference in air pressure outside the flip chips and under the flip chips.

While the above described prior art system is effective in preventing voids in underfill material in flip chips, the system is relatively large and the time required to purge air from the air tight chamber is rather long. Further, because the airtight chamber is so large, it is difficult to effectively purge air from the chamber. In addition, the air tight chamber of the prior art accommodates only manual loading of the flip chips into the chamber, preventing the dispensing system contained within the chamber from being effectively used in an automated assembly line. Moreover, the large size of the airtight chamber often precludes it from easy integration into automated manufacturing processes.

An additional system for encapsulating electronic components such as flip chips is described in U.S. Pat. No. 6,000,924, the contents of which are incorporated herein by reference. The system described in the patent uses a special mold to seal the chip against the substrate during encapsulation. The system includes a resilient bumper means to maintain the seal of the mold around the chip, and, encapsulant is injected by the system an elevated pressure. However, this patent does not address the problem of keeping the chip and substrate in a clean condition.

Another drawback associated with such underfilling processes is that the underfill material often contaminates the chip and the substrate during and after the underfill process. The time required to restore the chip and substrate to a clean condition lengthens the manufacturing process and increases the manufacturing cost. In addition, any contaminants that remain on the chip or substrate may degrade the performance of the chip.

SUMMARY OF THE INVENTION

In one aspect, the present invention overcomes disadvantages of the prior art by providing a system, apparatus and process for encapsulating flip chips using dispensing systems having fixtures operating cooperatively with injection and vacuum valves to overcome drawbacks of the prior art systems.

In one embodiment of this aspect, a dispensing system includes a controller, a vacuum source in electrical communication with the controller, the vacuum source applying a vacuum to at least a portion of the substrate in response to an instruction from the controller, and an injector in electrical communication with the controller and having a vacuum port in communication with the vacuum source, the injector comprising a valve in communication with a pressure source and a material source, the valve permitting material to be dispensed from the material source onto a substrate in accordance with an instruction from the controller.

In another aspect, the present invention provides systems, methods, and devices for individually underfilling and/or encapsulating flip-chips in a vacuum environment while maintaining a clean condition to both the chip and the substrate during the underfill process and after the underfill process is complete. A system implemented in accordance with one embodiment of the present invention comprises a tooling mechanism, gasket, pressure pad, and an injector capable of puncturing a film held against a surface of the tooling mechanism. The gasket and tooling mechanism work in connection with a film disposed between the underfill system and the gasket to improve the cleanliness of the flip chip and substrate. Dispensing needles project through the film to dispense encapsulant to the chip disposed below the film, while the film helps prevent excess encapsulant from flowing onto the chip itself.

In another embodiment of this aspect, the invention provides a method for underfilling or encapsulating a component, such as a chip mounted on a substrate. A film sized to cover at least a portion of the component is disposed at a first location. An injector, which includes an injection needle and a vacuum needle, each of which is capable of puncturing the film is projected through the film to pierce the film, and after piercing the injector remains at least partially projecting through the film. A pressure pad at the first location helps hold the film in a substantially fixed position so that the injector can pierce the film. The injector, together with the film through which it is projected, is moved to a second location, and a component to be underfilled is placed in a fixture at the first location. Then, the injector with film is moved from the second location towards the first location. The pressure pad seals the film against a surface of the component, so that the injector is disposed in a location to underfill the component. The injector then injects underfill material around the surface of the component to be underfilled. During and after the underfill process, the film helps prevent underfill material from contacting surfaces other than the surfaces to be underfilled.

In another aspect, the present invention provides an apparatus for adding encapsulant material to a component attached to a substrate. The apparatus comprises an injector, a fixture, and a sheet of substantially taut film. The injector has an injecting outlet with an injecting tip through which encapsulant material is injected to a process area on the substrate and an air inlet with an inlet tip through which air is drawn from a process area on the substrate. The fixture is in communication with the injecting outlet and the air inlet and includes a receptacle for receiving the substrate and a gasket capable of forming a seal around at least a portion of the injecting outlet and vacuum outlet. The film is disposed between the injector and a substrate placed in the receptacle of the fixture, such that, when the injector is in a position for dispensing encapsulant to the process area on the substrate, at least the injecting tip and the inlet tip of the injector project through the substantially taut film to the process area.

In an embodiment of this aspect, the apparatus further comprises a pressure pad structured and arranged to pull the sheet of film substantially taut when the film is disposed adjacent the pressure pad. In another embodiment, the injecting tip and inlet tip are constructed and arranged to retract through the substantially taut film when dispensing of the encapsulant is complete. In still another embodiment, the apparatus includes a film moving member, such as a roller system, for disposing the film between the injector and the receptacle.

In another aspect, the present invention provides an apparatus for adding encapsulant material to a component attached to a substrate, where the substrate has a sheet of film covering a process area on the substrate. This apparatus comprises and injector and a fixture. The injector has an injecting outlet with an injecting tip through which encapsulant material is injected to a process area on the substrate and an air inlet with an inlet tip through which air is drawn from a process area on the substrate. The fixture is in communication with the injecting outlet and the air inlet and includes a receptacle for receiving the substrate and a gasket capable of forming a seal around at least a portion of the injecting outlet and vacuum outlet. The fixture is structured and arranged so that when the injector is in a position for dispensing encapsulant to the process area on the substrate, at least the injecting tip and the inlet tip of the injector project through the film on the substrate to the process area.

In still another aspect, the present invention provides a method for adding encapsulant material to a component attached to a substrate. An injector having an injecting outlet and an air inlet is provided, where the injecting outlet is capable of injecting encapsulant material to a process area on the substrate and the air inlet is outlet capable of drawing air from a process area on the substrate. A fixture for receiving the substrate also is provided, where the fixture includes a receptacle for receiving the substrate and a gasket capable of forming a seal around at least a portion of the injecting outlet and air inlet. A sheet of substantially taut film is disposed in the fixture between the injector and the receptacle.

Using the gasket, a seal is formed between the injecting outlet and the air inlet. At least a portion of the injecting outlet and air inlet is projected through the film. When a substrate having an attached component and a process area is provided in the receptacle of the fixture, the injecting outlet and the air inlet are moved to a dispensing position for the process area of the substrate, whereby the injecting outlet and air inlet project through the film to the process area. Then, encapsulating material is dispensed from the injecting outlet into a process area on the substrate, and air is drawn from the process area using the air inlet, to draw the encapsulating material through the process area.

Embodiments of this aspect can include the following. In one embodiment, the injecting outlet and air inlet are retracted from the substrate when dispensing is substantially complete. In another embodiment. In another embodiment, retracting the film sealed to the injecting outlet and air inlet retracts the injecting outlet and air inlet from the substrate. In still another embodiment, the injecting outlet and air inlet are retracted back through the film. In yet another embodiment, the film is removed from the fixture. In additional embodiments, the air inlet and the injecting outlet pierce through the film to project through the film, or can project through respective holes formed in the film.

In still another aspect, the present invention includes an apparatus for adding encapsulant material to a component attached to a substrate. This apparatus includes a means for a means for injecting encapsulant material to a process area on the substrate, a means for holding the substrate while encapsulant material is added, a means for forming a seal around at least a portion of the outlet and inlet of the injecting means, and a means for forming a barrier between the holding means and the injecting means.

The injecting means, which is is in communication with the holding means, includes an outlet for dispensing encapsulant material to a process area on the substrate and an inlet for drawing air from a process area on the substrate. The barrier means prevents encapsulant material from contaminating the receiving means and areas of the substrate outside of the process area and permits the outlet and the inlet to access the process area of the substrate.

Embodiments of this aspect include the following. In one embodiment, the apparatus further comprises a means for applying pressure to the barrier means so that the barrier is substantially taut when the barrier means is disposed adjacent the pressure means. In another embodiment, the barrier means is disposed on a surface of the substrate. In still another embodiment, the inlet and outlet are constructed and arranged to pass through the barrier means for dispensing encapsulant and pass back through the barrier means when dispensing of the encapsulant is complete. In yet another embodiment, the apparatus further comprises a barrier moving means for moving the barrier means to and from a position between the injecting means and the holding means.

The foregoing and other objects, aspects, features, and advantages of the invention will become more apparent from the following description and from the claims.

BRIEF DESCRIPTION OF THE DRAWINGS

For a better understanding of the present invention, reference is made to the drawings, which are incorporated herein by reference, and in which.

DETAILED DESCRIPTION

Figure 1:
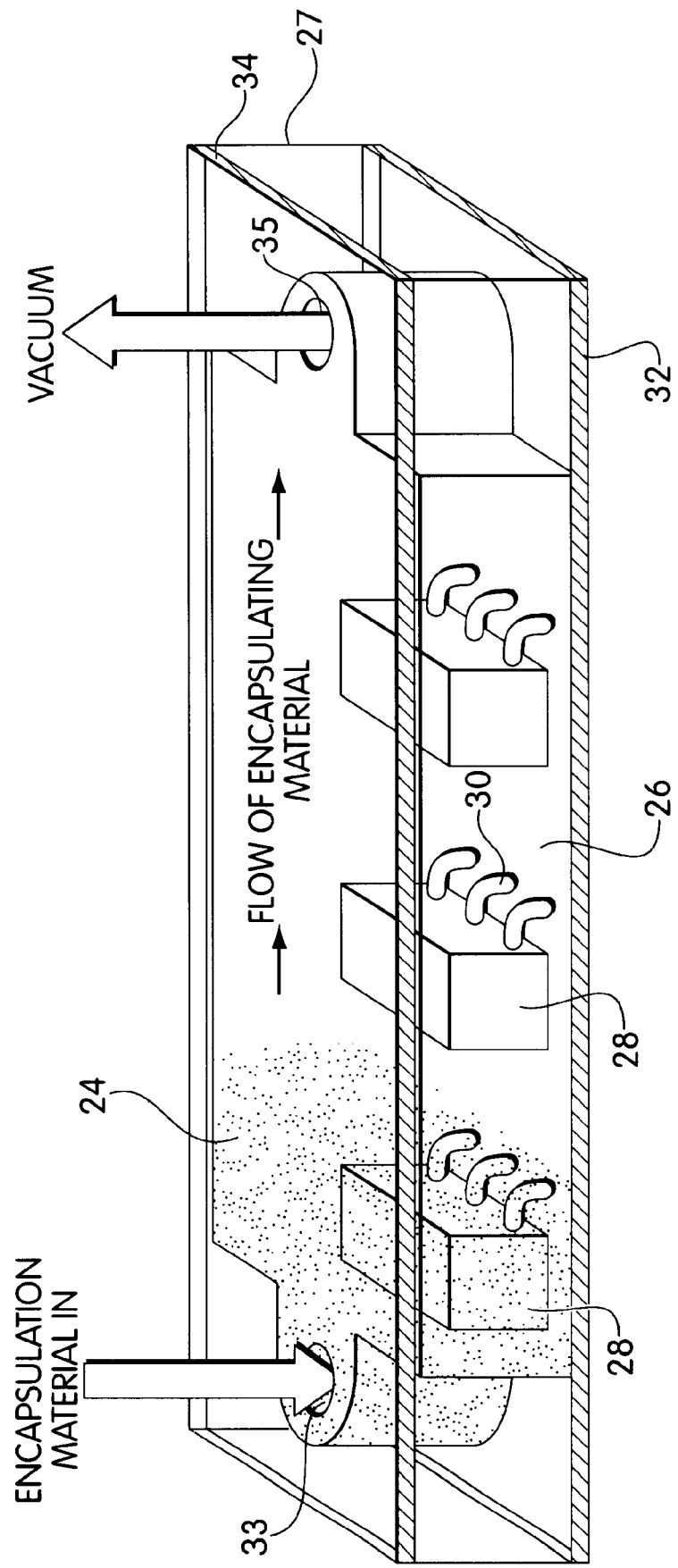
FIG. 1 illustrates a workpiece usable in accordance with the invention and shows the flow of encapsulating material at the workpiece in accordance with an embodiment of the invention.

For purposes of illustration, embodiments of each aspect of the present invention will now be described with reference to a dispensing system used to dispense underfill material beneath and around electronic components such as flip chip integrated circuits. One skilled in the art will appreciate, however, that embodiments of the present invention are not limited to dispensing underfill materials for flip chip integrated circuits, but may be used in many other applications, including, for example, encapsulating components.

As used in this description, the term "vacuum" does not necessarily refer only to producing a space entirely devoid of matter, but rather is intended also to encompass producing a space from which matter, especially air, has been partially or substantially removed.

In the Figures of this application, in some instances, a plurality of system elements may be shown as illustrative of a particular system element, and a single system element may be shown as illustrative of a plurality of a particular system element. It should be understood that showing a plurality of a particular element is not intended to imply that a system implemented in accordance with the invention must comprise more than one of that element, nor is it intended by illustrating a single element that the invention is limited to embodiments having only a single one of that respective element. In addition, the total number of elements shown for a particular system element is not intended to be limiting; those skilled in the art will recognize that the number of a particular system element can be selected to accommodate the particular user needs.

One technique for encapsulating electronic components is described in an application filed under the Patent Cooperation Treaty (PCT) having Publication Number WO 99/563F16, the contents of which are incorporated herein by reference. In the described method, electronic components are disposed in an assembly having top and bottom sealing layers defining an enclosed space containing the components. The assembly is engaged in a test fixture, and the enclosed space is evacuated by applying a vacuum to a hole in one of the sealing layers. Then, the vacuum is removed from the hole, a needle is advanced into that hole, and a liquid encapsulant is injected through the needle into the enclosed space around the electronic components. The encapsulant flows into the enclosed space, where it is free to flow around the components.

One disadvantage of this method, however, is that the vacuum and encapsulant flowing through the needle must be precisely controlled to ensure proper flow. Another disadvantage is that the injected liquid encapsulant may not flow sufficiently around and under all of the components to properly encapsulate each component. Still another disadvantage is that excess encapsulant can flow back out of the hole and contaminate the assembly, text fixture, vacuum, or other elements. Yet another disadvantage is that waiting for the liquid encapsulant to flow around each component increases the process time for encapsulating the components.

FIG. 1 illustrates a workpiece 27, such as a substrate, having components 28 that may receive encapsulant material 24 using processes and apparatuses of the present invention. In FIG. 1, material 24 is shown flowing through the workpiece during an encapsulation process. The workpiece 27 includes a hollow area 26, in which several components to be encapsulated, namely electronic components 28 having leads 30, are disposed. The hollow area 26 of workpiece 27 in FIG. 1 can be formed between a top coverlay tape 34 disposed on the "die side" (i.e., the top of the components 24) and a bottom coverlay tape 32 disposed on the "contact side" (i.e., the bottom of the components 28). An injection hole 33 is formed in the top coverlay tape 34 at a first side of the hollow area 26 to permit encapsulation material 24 to be injected. Similarly, a vacuum hole 35 is formed in the top coverlay tape 24 to permit a vacuum to be drawn on the hollow area 26. Having the injection hole 33 and vacuum hole 35 as separate holes, disposed on opposite sides of the hollow area 26, is advantageous because the vacuum being pulled at the vacuum hole 35 helps to rapidly draw the material 24 through the hollow area 26 and around the components 28 and also helps to ensure that the material 24 flows around, over, and under all of the components 28. In addition, the top coverlay tape 24 and bottom coverlay tape 32 help to prevent the material 24 from contaminating a fixture holding the workpiece 27.

It should be understood that illustration of three electronic components 28 is not intended to be limiting; any number of components can be disposed in the hollow area 26. Further, the articles disposed in the hollow area 26 need not be electronic or other types of components, but rather can include any articles to be encapsulated. As FIG. 1 illustrates, the material 24 not only flows around the components 24 but also flows around the leads 30 of the components 28, thereby helping to prevent voids in the encapsulant.

Figure 2:
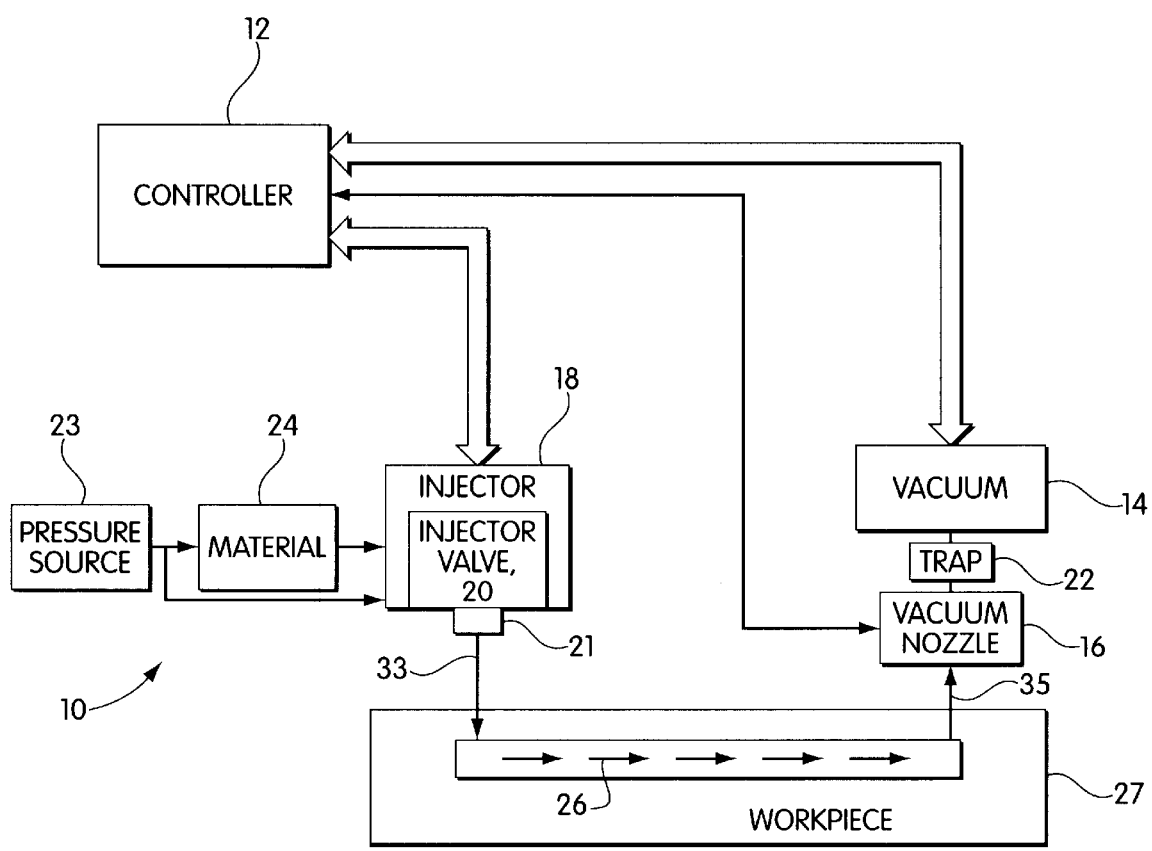
FIG. 2 is a block diagram illustration of a vacuum injection system, in accordance with one embodiment of the invention.

FIG. 2 shows a block diagram of one embodiment of a vacuum injection system 10 in accordance with the invention, for dispensing media such as underfill material along the sides, underneath, and between components such as flip chip integrated circuits (not shown) disposed on a workpiece 27 or carrier (not shown). The vacuum injection system 10 includes a controller 12, a vacuum source 14 having a nozzle 16, an injector 18 having an injector valve 20, and a trap 22. The injector 18 injects underfill material 24 receiving force from a pressure source 23. During operation of the vacuum injection system 10, the vacuum nozzle 16 connects to the vacuum hole 35 on one side of the hollow area 26 in the workpiece 37 so that the vacuum source 14 can draw a vacuum on the hollow area 26, while the injector valve 20 permits the injector 18 to inject encapsulating material 24 into the injection hole 33. The vacuum applied by vacuum source 14 draws the encapsulating material 24 from the injection hole 33 towards the vacuum source 14, so that the encapsulating material 24 can encapsulate and underfill all of the components in the hollow area 26 while substantially eliminating voids. This is explained more fully below.

The controller 12 can be any system or processor capable of controlling the vacuum injection processes described herein. For example, the controller 12 can be a programmable logic controller (PLC), a general purpose digital computer running one or more programs relating to control of the vacuum injection processes, or a proprietary processor system board. In one embodiment, the controller 12 is a proprietary processor system board having a plurality of input/output (I/O) control points. In another embodiment, the controller 12 can further include or access one or more daughter boards that can provide other circuit functions, such as analog I/O, high power switching, communications to peripherals, video display, and the like. In still another embodiment, the controller 12 is a computer having a PENTIUM microprocessor (manufactured by Intel Corporation of Santa Clara, Calif.) and storing and running a plurality of process instructions and associated software relating to control of the system 10. The controller 12 can be a stand-alone computer, such as a personal computer, or can be networked to one or more other computers.

In one embodiment, the controller 12 stores a plurality of process "recipes" relating to encapsulating components and/or assemblies on the workpiece 27. For example, a process recipe may include all instructions and control programs necessary to encapsulate a predetermined quantity of a predetermined component disposed on a fixture having a predetermined size. Because the controller 12 is in communication with the injector 18 and the vacuum source 14, it can program either or both of these elements to operate in accordance with a particular process for a particular component or material. In another embodiment, the controller 12 can monitor the vacuum level at the vacuum source 14 and adjust it as necessary. In another example, the controller 12 can control the injector 18 to inject material 24 for a predetermined time by enabling and disabling the injector valve 20.

For example, the controller 12 can instruct the vacuum source 14 to apply a predetermined vacuum level (e.g., 5 inches of mercury (in./Hg)) to the workpiece 27 and to maintain this vacuum level for a predetermined time. While the vacuum level is maintained, the controller 12 directs the injector 18 to configure the injector valve 20 to inject a specific quantity (e.g., 1 cubic centimeter (cc)) of a material 24, for example silicone encapsulant, from a particular source of material 24, such as a particular cartridge or syringe of material 24.

Vacuum source 14 can be a pump, such as an oil-free vacuum pump, capable of reaching a predetermined vacuum level within a predetermined time. In one embodiment, the vacuum pump is a diaphragm-style pump manufactured by Varian Associates of Lexington Mass. For example, in one embodiment, the vacuum source 14 can reach a maximum vacuum of 28 in./Hg within 5 seconds. The vacuum level and time during which vacuum is applied can be set; for example, they can be programmed by controller 12 or set manually using one or more switches. Depending on how it is programmed, the vacuum source 14 can apply a vacuum at its nozzle 16 to the hollow area 26 before, during, and/or after injection of the material 24. This permits the vacuum source 24 to "draw" injected material 24 through the hollow area 26 after the material 24 has been injected, thereby encapsulating components therein without voids. In addition, by continuing to apply a vacuum to the hollow area 26 after injection of the material 24, the material 24 can be drawn through the hollow area 26 faster than the material 24 flows without the vacuum being applied.

The trap 22 is disposed between the vacuum source 14 and the vacuum nozzle 16 to trap possible excess material 24 injected into the hollow area 26 of the workpiece 27, to prevent contamination of the vacuum source 14. For example, the trap 22 can be a jar having a removable reservoir, so that material 24 in the trap 22 can be removed easily. In one embodiment, the trap 22 includes a disposable and easily removed reservoir. Many different types and styles of reservoir-type devices are usable in accordance with this aspect of the invention, as those skilled in the art will recognize.

In one embodiment, the trap 22 can include a level sensor (not shown) capable of detecting the level of material 24 in the trap 22. Those skilled in the art will recognize that many different types of sensing devices are usable to detect the level of material 24 in the trap 22. The level sensor can stop the injection process if the material 24 in the trap 22 reaches a predetermined level, such as if the trap 22 becomes three quarters full. Alternately, the controller 12 can monitor the level of material 24 and stop the injection process if the material 24 in the trap 22 reaches a predetermined level. The vacuum source 14 is coupled to a vacuum nozzle 16 adapted to fit tightly to the vacuum hole 35 on the workpiece 27.

The injector 18 can accommodate workpieces 27 and/or hollow areas having differing sizes. The injector 18 can include an injection port 21 that fits tightly to (or within) the injection hole 33 on the workpiece 27 to inject material 24 into the hollow area 26 after the vacuum source 14 has evacuated air from the hollow area 26. In another embodiment, the injector 18 can begin injecting material 24 into the hollow area 26 while the vacuum source 14 is evacuating air from the hollow area 26. A pressure source 23, such as a cartridge assembly manufactured by EFD Inc. of Providence, R.I., uses pressure to force the material 24 out of the injection port 21 and into the hollow area 26. In one example, the material 24 is stored in a cartridge or syringe and pressure is applied to the cartridge to force material 24 from the cartridge out through the injection port 21. In one embodiment, the pressure source 23 can be an air-driven or mechanical ram.

The injector 18 provides a positive shut-off, which can help to prevent material 24 from dripping out of the injection port 21 after pressure on the material 24 is released or after injection of a predetermined quantity of material 24 is complete. In one embodiment, the positive shut-off is provided using a valve 20 that is precisely controlled by controller 12. This aspect is described more fully below. In another embodiment, the injector 18 can include one or more ports (not shown) accepting syringes and/or cartridges containing material 24 to be injected. In still another embodiment, the injector 18 can be supplied with material 24 from a bulk feeding device such as a ram pail pump, such as the DynaMite 190 manufactured by Graco, Inc. of Minneapolis Minn. The controller 12 can communicate with the injector valve 20 to control operation of the injector 18, when injection occurs, to control the level of pressure applied at the pressure source 23, to release the pressure on the pressure source 23, to select the source of material 24, and to control the flow of material 24 into the injector 18.

The material 24 can be any material used for encapsulating articles. For example, some materials, such as silicone chip encapsulant material, can be used as a compliant layer to decouple the mismatched thermal expansion rates of silicon and common printed circuit board (PCB) laminates (to which a silicon electronic component being encapsulated may later be attached). Silicone chip encapsulant material can also increase the solvent resistance of the article being encapsulated.

The workpiece 27, integrated circuits or other substrates that are to receive dispensing material in the system 10 can be transported as individual units on conveyors, multiple units in a common carrier, or using a continuous tape feeder system. The workpiece 27 can, in one embodiment, include such individual units, multiple units on a common carrier, or a continuous tape feeder system. The system 10 may include a conveyor (not shown in FIG. 1, but illustrated in FIGS. 4–8) for loading and unloading integrated circuits or multiple unit common carriers into the dispensing system. Alternatively, the system 10 may be configured as known in the art for receiving a continuous tape having integrated circuits that are to receive encapsulant material bonded to the top surface of the tape.

Figure 3:
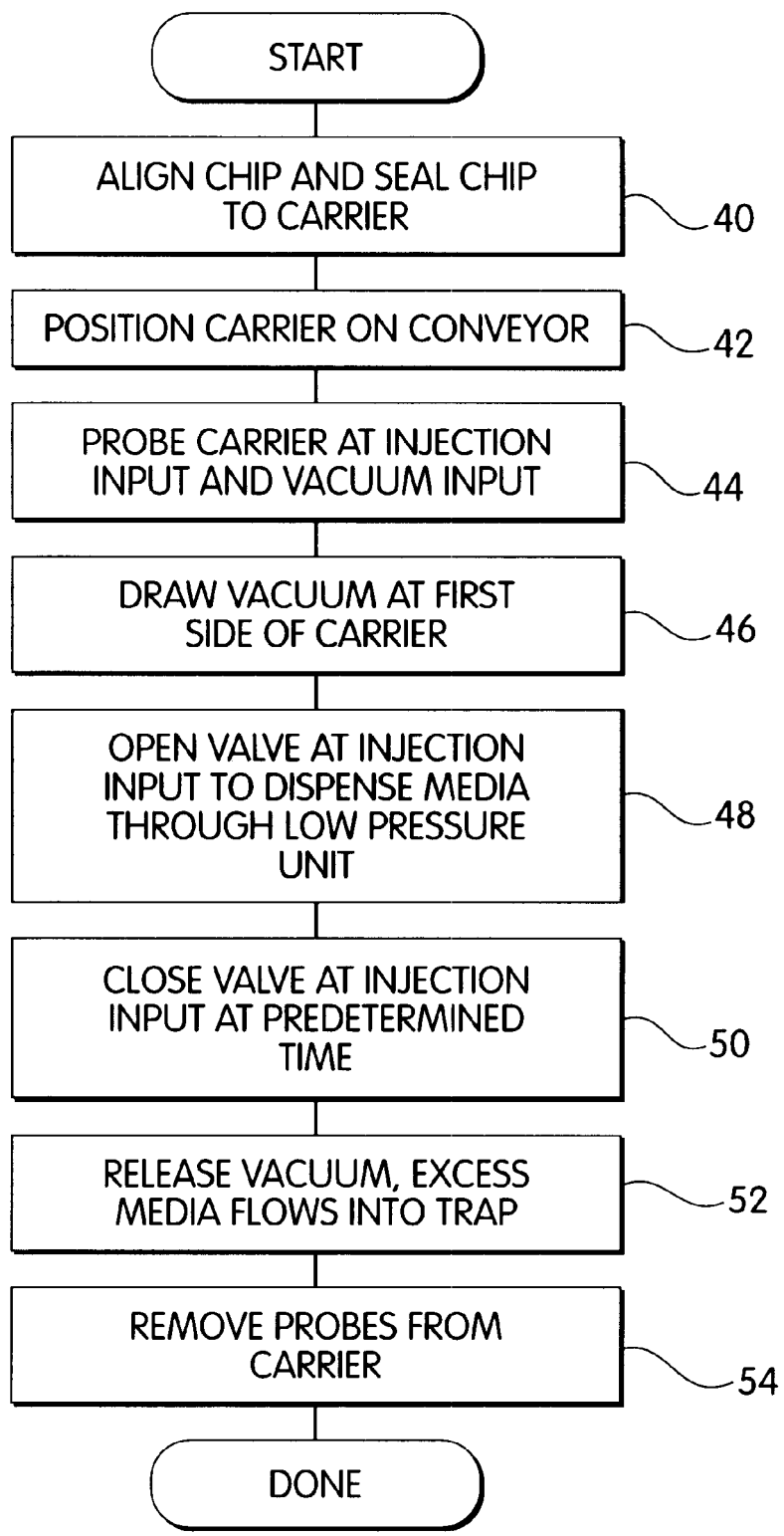
FIG. 3 is flow chart representation of a vacuum injection process, in accordance with one embodiment of the present invention.
Figure 4:
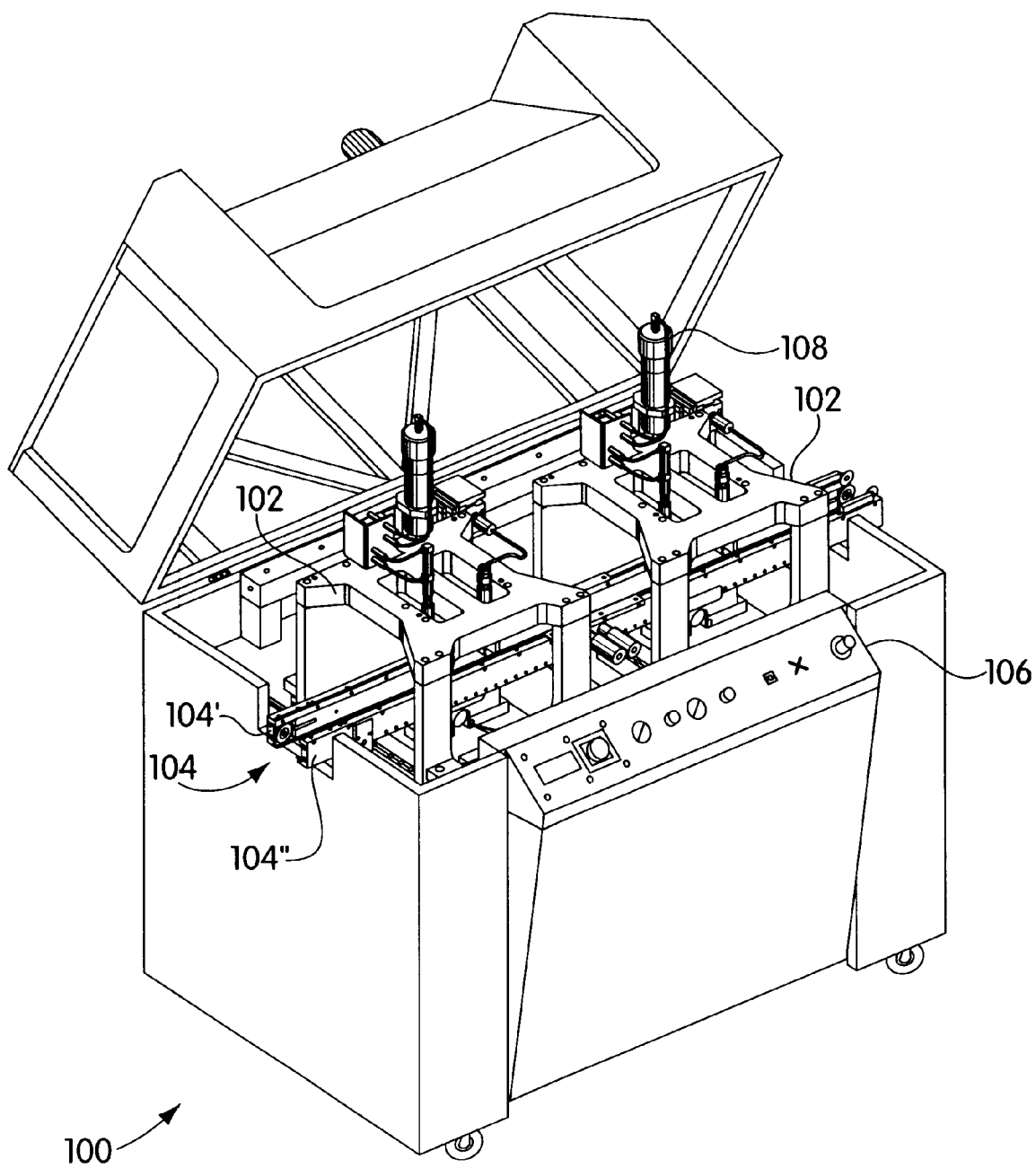
FIG. 4 is a perspective view of a vacuum injection system, in accordance with one embodiment of the invention.

FIG. 3 illustrates a flow chart of a process for encapsulating components using the system 10 of FIG. 1, in accordance with an embodiment of the invention. In a first step of the process, the chip or component 28 is aligned on the workpiece 27 or carrier and is sealed, such as by the top and bottom coverlay tapes 34, 32 of FIG. 2 (step 40). The carrier or workpiece 27 at an injection point in the system 10 is positioned on a conveyor (step 42). The vacuum and encapsulation holes 35, 33 (also referred to as vacuum input and injection input, respectively) are contacted by the vacuum and injection ports (step 44). The vacuum source 14 draws a vacuum at a first side of the workpiece 27 (step 46) to evacuate air from the hollow area 26 containing the components 28 to be encapsulated while simultaneously drawing encapsulant material 24 through the hollow area 26. In one embodiment, prior to step 44 the workpiece 27 may be lifted off of the conveyor to place the vacuum and injection ports 35, 33 in contact with the vacuum nozzle 16 and a nozzle at the injector 18.

After the vacuum source 14 begins applying the vacuum, the injector valve 20 opens to begin dispensing material 24 into the hollow area 24 (step 48). Because the material 24 is at a pressure higher than that in the hollow area 26, the material 24, after being injected from the injector valve 20 is drawn through the hollow area 26, towards the vacuum hole 35. In addition, because the vacuum source 14 is applying a vacuum to the hollow area 26, the material 24 will flow through the hollow area 26 faster than if the hollow area 26 were evacuated then the vacuum was removed. The controller 12 determines how long the vacuum source 14 applies the vacuum and how long the injector 18 can inject material based on a number of factors, which can include the size of the hollow area 26, the number of components 28, the type of material 24, the level of the vacuum being applied, and the amount of material in the trap 22. Those skilled in the art will recognize that other factors may affect the time for encapsulation. Based on information from the controller 12, the injection valve 20 is closed at a predetermined time to stop the injection of material 24 into the hollow area 26 (step 50), and the vacuum is released at a predetermined time. Any excess material 24 that flows out of the vacuum hole 35 flows into the trap 22 and is contained in the trap 22, instead of contaminating the vacuum source 14 (step 52). Then, the injector 18 and vacuum source 14 are be removed from the injection and vacuum holes 33, 35 (step 54), and the next encapsulation step (such as curing of the encapsulant) can proceed.

Note, however, that other events can cause the injection valve 20 (and/or the vacuum valve 16) to stop the encapsulation process from continuing. For example, if a sensor in the trap 22 indicates that the material 24 in the trap 22 reaches a predetermined level, the sensor in the trap 22 can either disable the vacuum source 14, or close the injector valve 20, to stop the vacuum from drawing material 24 through the hollow area 26. It should also be understood that the order of steps 50 and 52 can be reversed; that is, the vacuum can be released before the injection valve 20 is shut.

An embodiment of an automated vacuum encapsulation system 100 in accordance with the present invention will now be described with reference to FIGS. 1 and 4–9. The automated system 100 includes encapsulation assemblies 102, a conveyor 104, and a display and control panel 106. The panel 106 includes various indicators and switches permitting operators to monitor or control at least a portion of the encapsulation process being run at the system 100. For example, if the encapsulation system 100 included a trap 22 (FIG. 1), the panel 106 can include indicators informing an operator the status of the trap 22 (e.g., empty, quarter-full, three quarters full, etc.) or that the trap 22 must be emptied to avoid a shutdown of the system 100.

Also contained within the system 100 are control electronics for the vacuum encapsulation process, such as a controller 12, power circuitry (not shown), air sources (not shown), control pneumatics for the injectors 18 and other devices, cooling fans, and the like. In one embodiment, the control electronics includes a controller 12 having a microprocessor such as a PENTIUM processor, which can be programmed to control the dispensing system, to control the flow of workpieces 27 such as integrated circuits into and out of the dispensing system, and to operate some or all of the other control electronics.

The conveyor 104 of the encapsulation system 100 flows from left to right and is manually adjustable to accommodate parts of varying widths. For example, in this embodiment, the conveyor 104 can be adjusted from 50 mm to 180 mm between its rails 104', 104". A plurality of sensors (not shown) are operable with the conveyor 104 to sense when a workpiece 27 (FIG. 1) has been placed at the entrance end (left side) of the conveyor 104 and to sense when a workpiece 27 has reached an injector assembly 102. The conveyor 104 is made from materials that are safe from electrostatic discharge (ESD).

Figure 5:
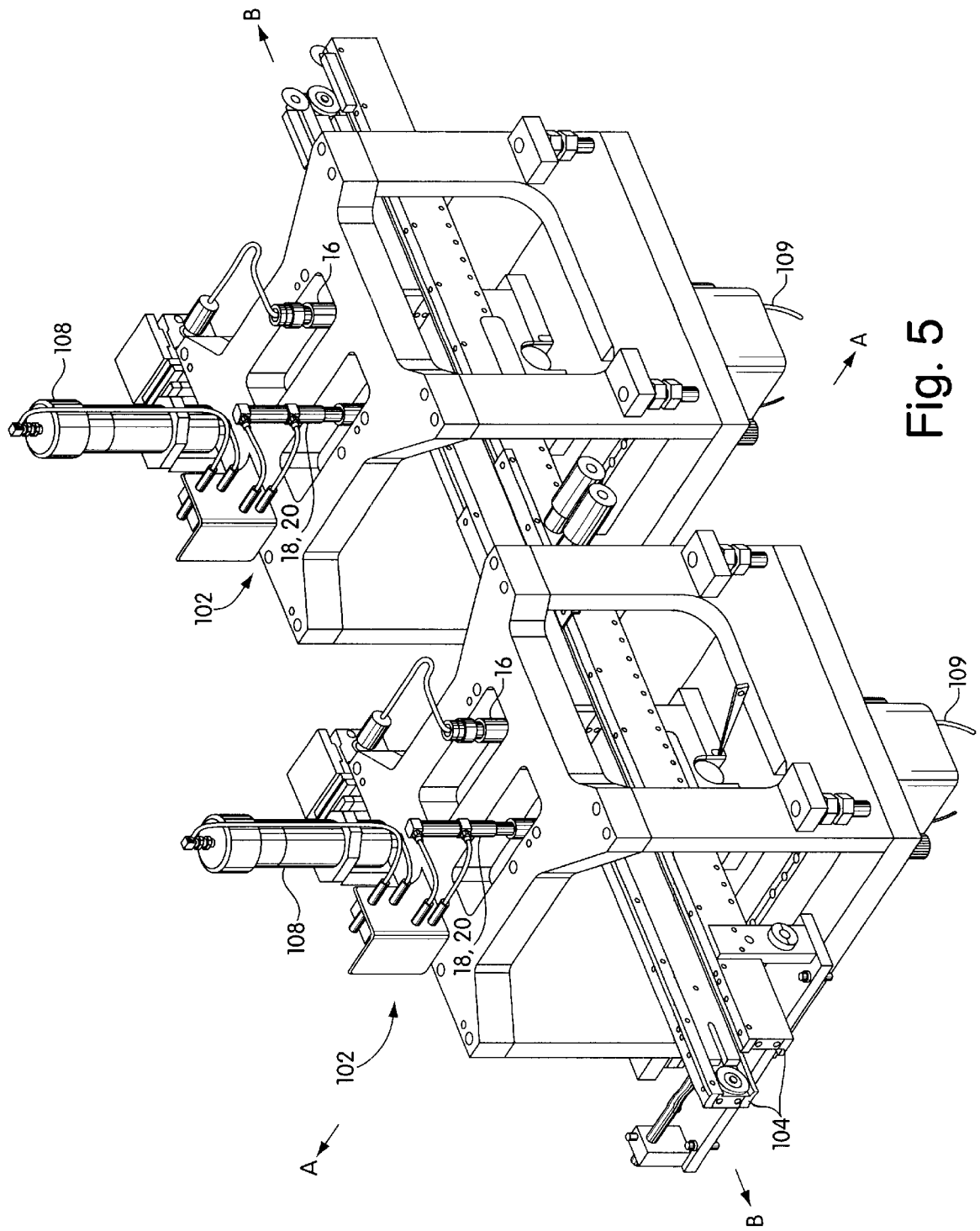
FIG. 5 is a perspective view of the conveyorized portion of the vacuum injection system of FIG. 4.

Referring to FIG. 5, the injector assemblies 102 are illustrated in greater detail. Each injector assembly 102 includes a material assembly 108 dispensing material 24 used for encapsulation. For example, the material assembly 108 accepts 80 cc syringes and 150 cc cartridges as reservoirs for material 24. The locations of the material assemblies 108 ensure that they can be easily accessed and maintained by operators of the system. If the system 100 is running in a continuous high volume environment, however, the materials assembly 108 can be coupled to a bulk material feeding device to avoid frequent replenishment of material 24 while running.

Figure 8:
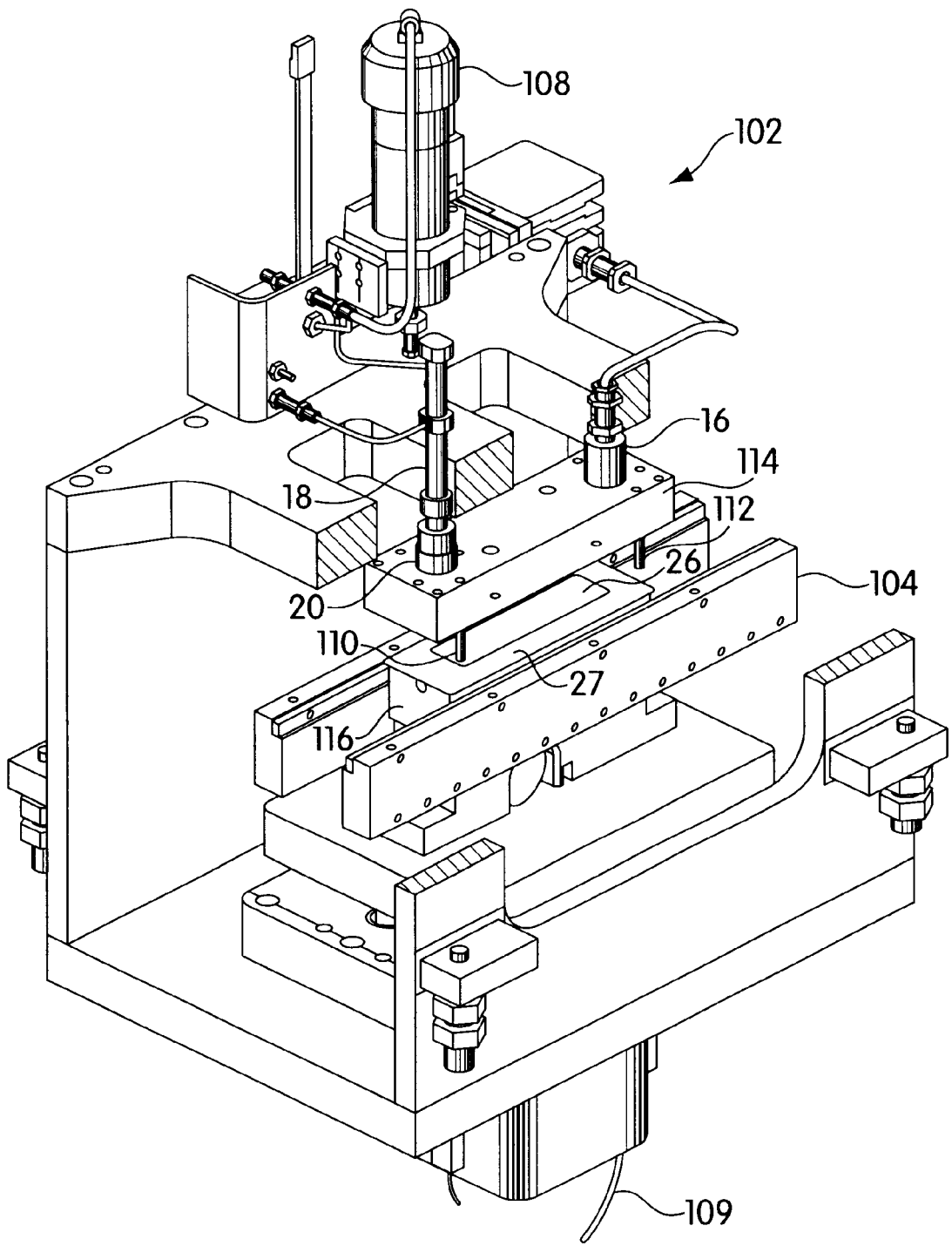
FIG. 8 is another side view of the conveyorized portion of FIG. 5, viewed along the BB axis, illustrating the conveyorized portion in more detail.

As workpieces 27 move along the conveyor 104, when the workpiece 27 reaches the injector assembly 102, a pneumatic assembly 109 helps to lifts the workpiece 27 off of the conveyor 104 and towards the injector assembly 102 (this is shown in greater detail in FIG. 8). When lifted, the workpiece 27 is disposed to contact its injection hole 33 and vacuum hole 35 with a nozzle of the injector valve 20 (not shown in FIG. 5) of the injector 18, and the vacuum nozzle 16 coupled to the vacuum source 14 (not shown in FIG. 5), respectively.

Figure 6:
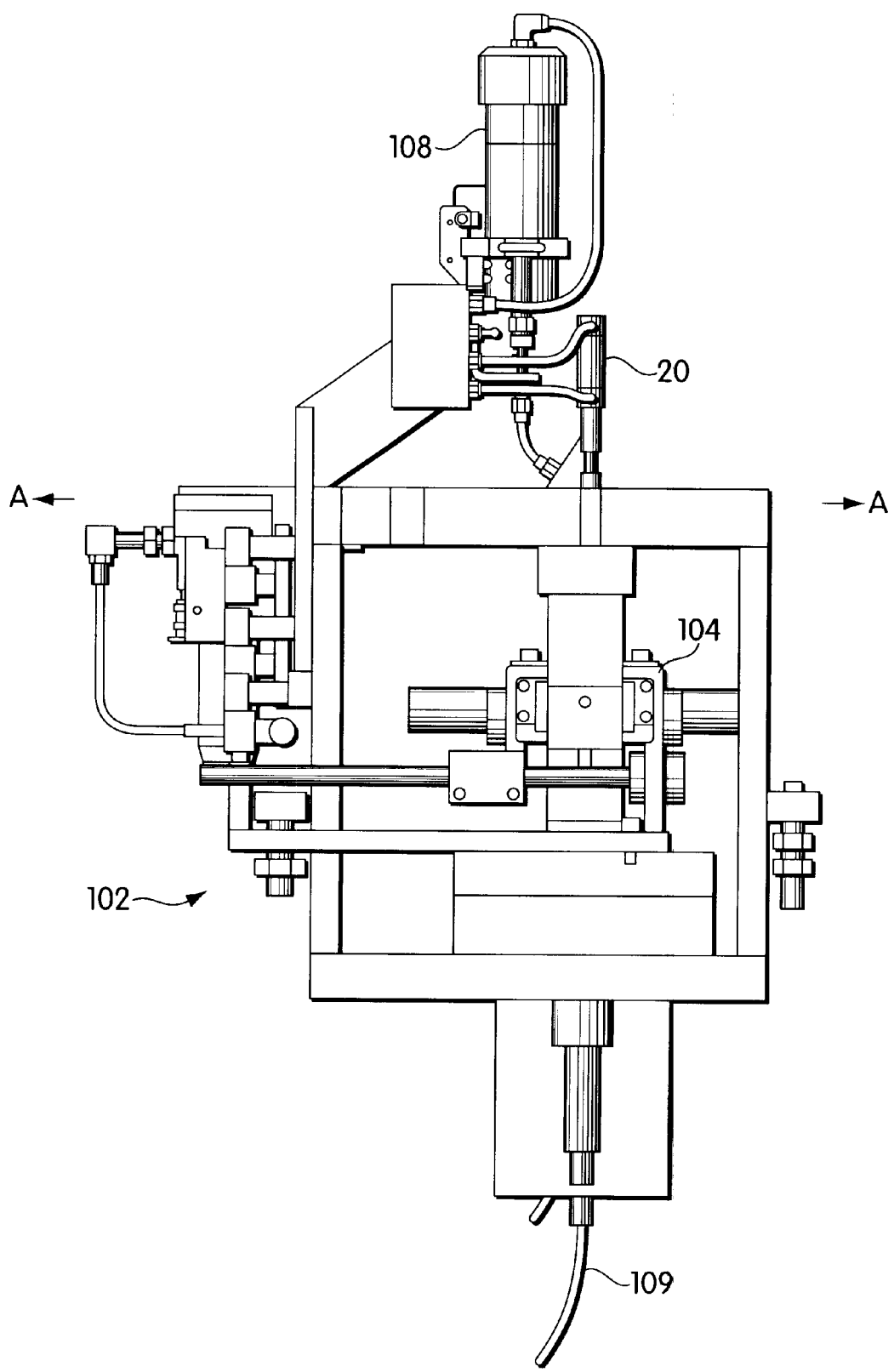
FIG. 6 is a side view of the conveyorized portion of FIG. 5, viewed along the AA axis.

FIG. 6 illustrates a side view of an injector assembly 102 of FIG. 5 taken along the A—A line. This view illustrates the relative physical locations of the injector valve 20 and the pneumatic assembly 109 to the conveyor 104.

Figure 7:
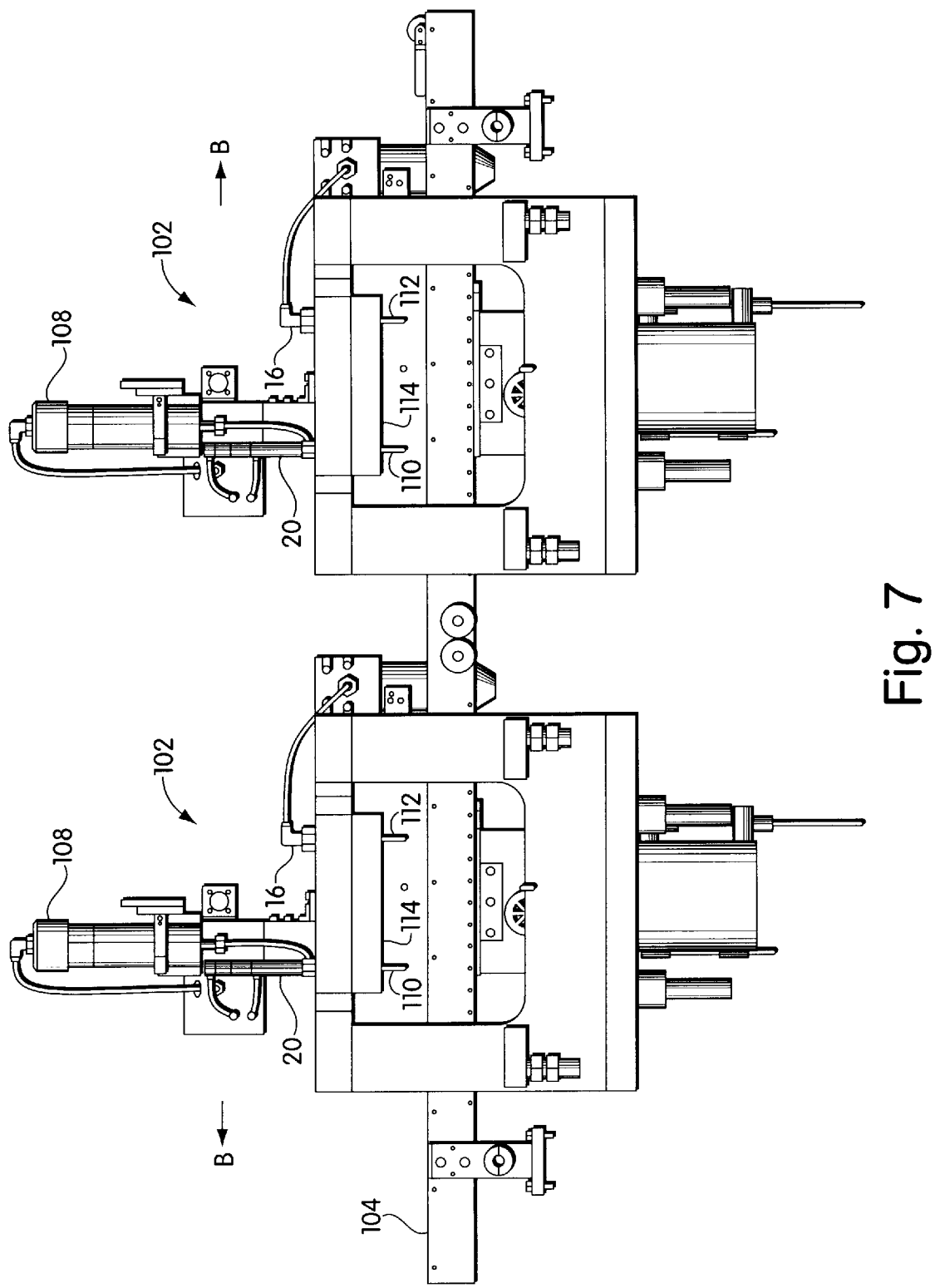
FIG. 7 is a side view of the conveyorized portion of FIG. 5, viewed along the BB axis.

FIG. 7 illustrates another side view of the injector assemblies 102 of FIG. 5 taken along the B—B line. In this view, alignment pins are 110, 112 are shown projecting from a top fixture element 114 in the injector assembly 102. The alignment pins 110, 112 mate with corresponding alignment holes in the workpiece 27, to ensure that the vacuum nozzle 16 and the injector 18 can make proper contact with the injection hole 35 and the vacuum hole 33. Although the alignment holes in the workpiece 27 are not illustrated, those skilled in the art will recognize that conventional alignment pins and alignment holes can be used to align the workpiece 27.

FIG. 8 illustrates still another side view of the injector assemblies 102 of FIG. 5 taken along the B—B line. In this view, the injector nozzle 20 and the vacuum nozzle 18 pass through the top fixture element 114, from which alignment pins 110, 112 project. The workpiece 27 is disposed on a movable bottom fixture element 116, which has been raised a predetermined distance above the conveyor 104, to bring the workpiece 27 towards the injector nozzle 20 and vacuum nozzle 18 at the top fixture element 114. The alignment pins 110, 112 are engageable with corresponding alignment holes in the workpiece 27 and in the bottom fixture element 112, to hold the workpiece 27 and the top and bottom fixture elements 114, 116 at a predetermined alignment.

As the alignment pins 110, 112 are engaged with the workpiece alignment holes and the bottom fixture element alignment holes, the top face of the bottom fixture element 116 is urged towards the bottom face of the top fixture element 114, until the injector nozzle 20 and vacuum nozzle 16 engage the injection hole 33 and vacuum hole 35 of the workpiece 27. Depending on the depth of the alignment holes, the length of the alignment pins 110, 112 and the thickness of the top fixture element 114 where the vacuum nozzle 16 and injector nozzle 20 pass through it, the top fixture element 114 may be in contact with the bottom fixture element 116 when the vacuum nozzle 16 and injector nozzle 20 are in proper engagement with the vacuum hole 35 and injector hole 33.

Although FIGS. 6–8 illustrate that the bottom fixture element 116 has alignment holes and the top fixture element 113 has alignment pins 110, 112, those skilled in the art will recognize that the top fixture element 114 could instead have the alignment holes and the bottom fixture element 116 could have the alignment pins. Similarly, although FIGS. 6–8 illustrate that the bottom fixture element 116 is lifted vertically above the conveyor 104 towards the top fixture element 114, it is possible to instead move the top fixture element 114 towards the bottom fixture element 116, or to move both the top fixture element 114 and the bottom fixture element 116 towards each other. In addition, the fixture element that contacts that contacts the workpiece 27 surface (or the die surface of a component on a carrier) can be adjustable to compensate for variations in the thickness of the workpiece 27 or die thickness. This compensation allows proper clamping and fixturing of the components being processed due to lot variations.

Figure 9A:
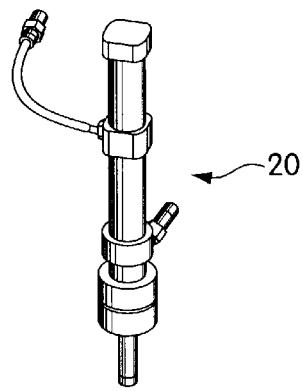
FIGS. 9A–9B are front and exploded views, respectively, of the injection valve of FIGS. 1–8, in accordance with one embodiment of the invention.
Figure 9B:
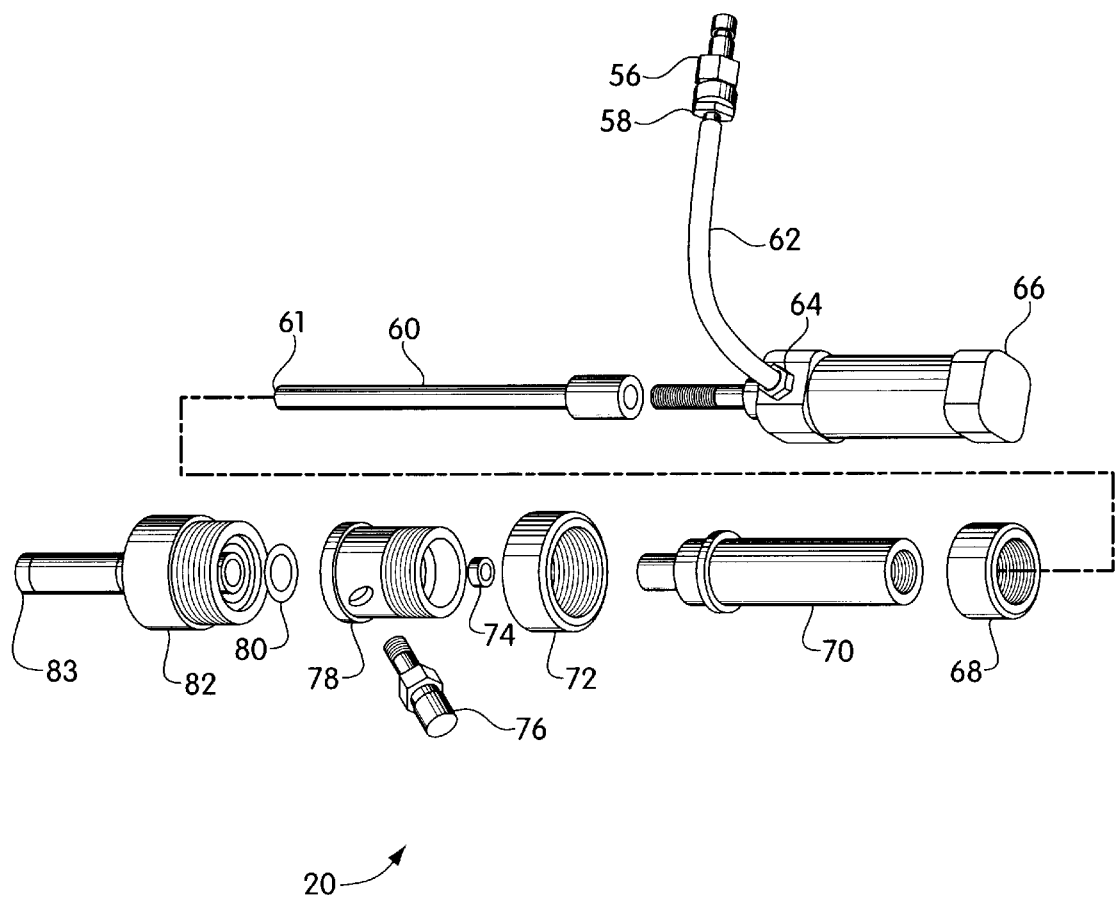

FIGS. 9A–9B illustrate an example of an injector valve 20 usable in accordance with an embodiment of the invention. The injector valve 20 includes a stroke cylinder 66, stopper rod assembly 60, and nozzle assembly 82, along with various fitting and hardware components, which operate together to provide a positive shut-off function that the controller 12 (FIG. 2) can control with precision. Each of these elements is described more fully below.

The nozzle assembly 82 includes a flexible nozzle tip 83 that forms a tight seal to the injection hole 33 of a workpiece 27 (FIGS. 1 and 2). The nozzle tip 83 is "doughnut" shaped and has an opening in the center therein through which material 24 to be injected can flow and which can receive the rod tip 61 of a stopper rod assembly 60 (described more fully below) to block the hole in the nozzle tip 83 and prevent material 24 from escaping. The nozzle assembly 82 is coupled to a first end of an upper body assembly 78 to which a nipple assembly 76 attaches. The nipple assembly 76 couples to a source of material 24, such as the material assembly 108 (FIGS. 4–7), for receiving material to be injected. An O-ring 80 helps to form a tight seal between the nozzle assembly 82 and the upper body assembly 78.

A piston seal 74 couples the second end of the upper body 78 to a first side of a bushing assembly 70 via a first retainer nut 72. A second retainer nut 68 couples the second side of the bushing assembly 70 to a stroke cylinder 66 and a stopper rod assembly 60. The stroke cylinder 66 is coupled via a length of tubing 62 and first, second, and third fittings 56, 58, 64, to a pressure source 23 (FIG. 2). In one embodiment, the stroke cylinder 66 can be an SMC Cylinder manufactured by Kinequip Inc., Buffalo, N.Y., such as Model. No. NCJ2B16-050T. This model can operate with a maximum pressure of 100 pounds per square inch (PSI), and those skilled in the art will recognize that other stroke cylinders having comparable specifications can be used in accordance with the invention.

The stopper rod assembly 60 is movably coupled to the stroke cylinder 66, such as by spring loading. During operation of the injector valve 20, pressure from a pressure source 23 (FIG. 1) can be applied and removed from the stroke cylinder 66. When pressure is applied, the pressure compresses the spring biasing within the stroke cylinder 66, thereby holding the stopper rod assembly 60 back from the nozzle tip 83. Thus, when pressure is applied, the stopper rod assembly 60 is disposed within the upper body 78 and nozzle assembly 82 to permit material 24 to flow through the nozzle tip 83 of the nozzle assembly 82, through an injection hole 33 (FIG. 1) and into the hollow area 26 of a workpiece 27 (FIG. 1).

When pressure is released, the spring biasing within the stroke cylinder releases and the stroke cylinder 66 can move the stopper rod assembly 60 through the bushing 70 and upper body 78 so that the rod tip 61 of the stopper rod assembly 60 is disposed at the opening in the nozzle tip 83 of the nozzle assembly 82, to prevent material 24 entering through the nipple 76 from escaping through the nozzle tip 83. Because the controller 12 (FIG. 2) can precisely control when and how pressure from pressure source 23 (FIG. 2) is applied, the flow of material 24 out of the injector valve 20 can be precisely controlled.

Figure 10:
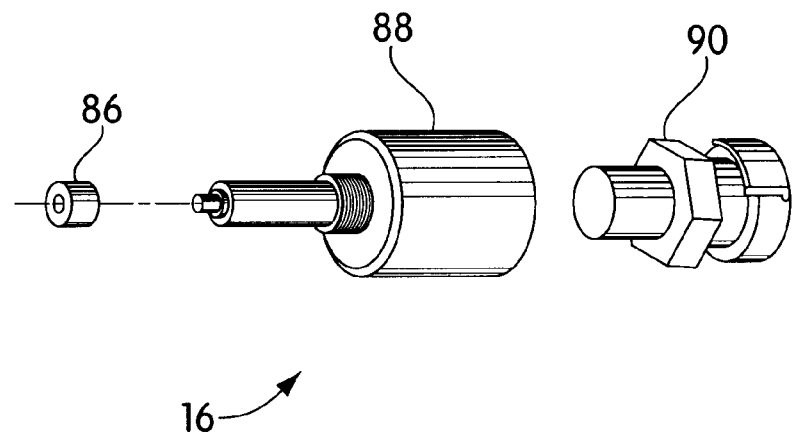
FIG. 10 is an exploded view of the vacuum nozzle FIGS. 1–8, in accordance with one embodiment of the invention.

FIG. 10 illustrates an example of a vacuum nozzle 16 usable in accordance with an embodiment of the invention. A nozzle body 88 has a seal 86 at one end and a fitting 90 at the other end. The fitting 90 and seal 86 are structured and arranged to be operable with the vacuum source 14 (FIG. 1) and to be coupled closely to the vacuum hole 35. Those skilled in the art will recognize the types of vacuum nozzles that may be usable in accordance with the invention.

As described herein, the present invention provides improved systems, methods, and apparatuses for encapsulation of articles such as electronic components. The controller and injector valve precisely control the flow of encapsulant into the workpiece, which ensures that a proper quantity of encapsulant is applied to the articles, improves the yield of the encapsulation process, and decreases waste of encapsulant. Having the controller control operation of the vacuum source provides precise control of the vacuum being applied to the workpiece. This permits the time and magnitude of the applied vacuum to vary based on the encapsulant used and the number and size of articles to be encapsulated.

In addition, use of a vacuum source applying a vacuum directly to the area containing articles to be encapsulated, as described herein, provides advantages over the prior art. First, applying a vacuum only to that area helps to reduce the size of the vacuum source required, thereby reducing the size of the dispensing system overall. Second, applying a vacuum to the area in which encapsulant is being injected at the same time that the encapsulant is being injected speeds the flow of encapsulant through the workpiece and helps ensure that the encapsulant thoroughly contacts all the articles to be encapsulated. In addition, use of a trap in connection with the vacuum source helps prevent encapsulant being drawn through the workpiece from contaminating the vacuum source or other areas outside of the workpiece.

In another aspect of the present invention, systems, methods, and apparatuses are provided for individually underfilling components, such as flip-chips, in a vacuum environment while maintaining a clean condition to both the chip and the substrate during the underfill process and after the underfill process is complete. In one embodiment, an apparatus of the invention uses a specially designed gasket and tooling mechanism that improves the vacuum environment during the underfill process. In addition, the apparatus uses a film to help prevent the deposition of excess underfill material from getting on the chip and substrate. In one embodiment, the film has at least one opening for receiving the underfill apparatus. In another embodiment, the underfill apparatus creates openings in the film. In still another embodiment, the underfill material comprises pelletized material for underfilling the components. Additional embodiments and configurations are described herein.

Figure 11:
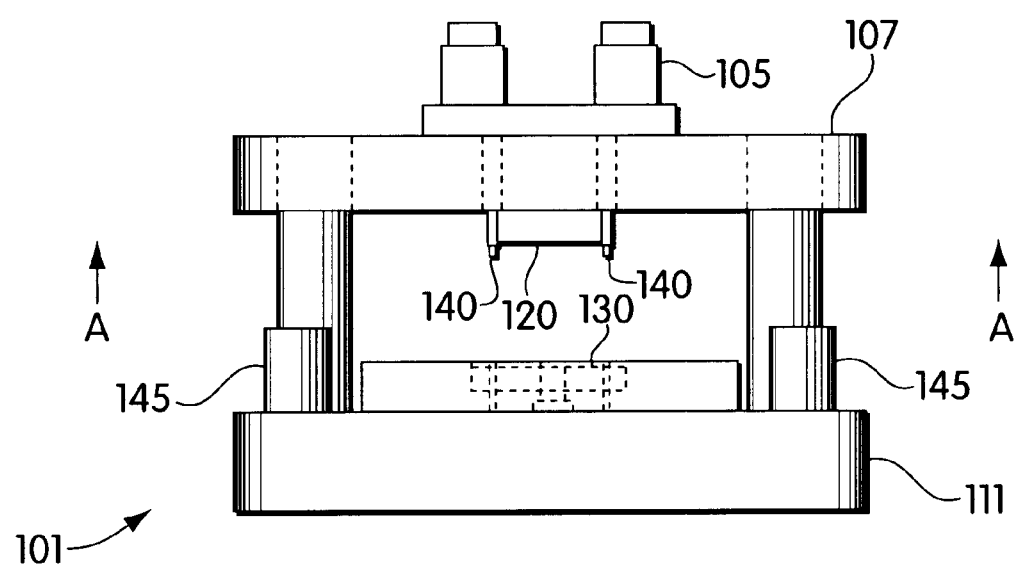
FIG. 11 is a side cross-sectional view of a system implemented in accordance with one embodiment of the invention.

Although the following describes use of an embodiment of the invention to underfill a component such as a flip chip, embodiments of the invention are not merely intended to be limited to underfilling flip chips. The invention is usable with other manufacturing techniques for which cleanliness is important, such as encapsulation, coating, and injection molding FIG. 11 provides a view of an apparatus 101 for underfilling components, implemented in accordance with one embodiment of the invention. FIG. 11 is a side view of the apparatus 101 in an "open" position. The apparatus 101 includes an injector section 105, a top portion 107, and a bottom portion 111. The bottom portion 111 has tooling designed to accommodate the component (e.g., a semiconductor and/or a chip) being underfilled, including a substrate on which the component being underfilled is mounted. A pressure pad 120 is coupled to the apparatus 101 and is used to apply pressure to a thin layer of film (not visible in FIG. 11) such that when the film is pressed against a die surface 130 of the apparatus 101, a pair of needles 140 can travel down to pierce the film. In one embodiment of the invention, the needles 140 can travel up to 120 mil. The needles are part of the injection mechanism of the apparatus 101.

In FIG. 11, the apparatus 101 is shown having a pair of positive stops 145 that are used to maintain a proper dispense position for the needles 140 and for the component (not shown) being underfilled. However, those skilled in the art will appreciate that the positive stops 145 are not required for this purpose and that, if positive stops 145 are used, fewer than two or more than two positive stops could be used. In addition, in this view the needles 140 are spring-loaded down. It is, of course, possible to use a mechanism other than spring-loading to position the needles 140 properly.

Figure 12:
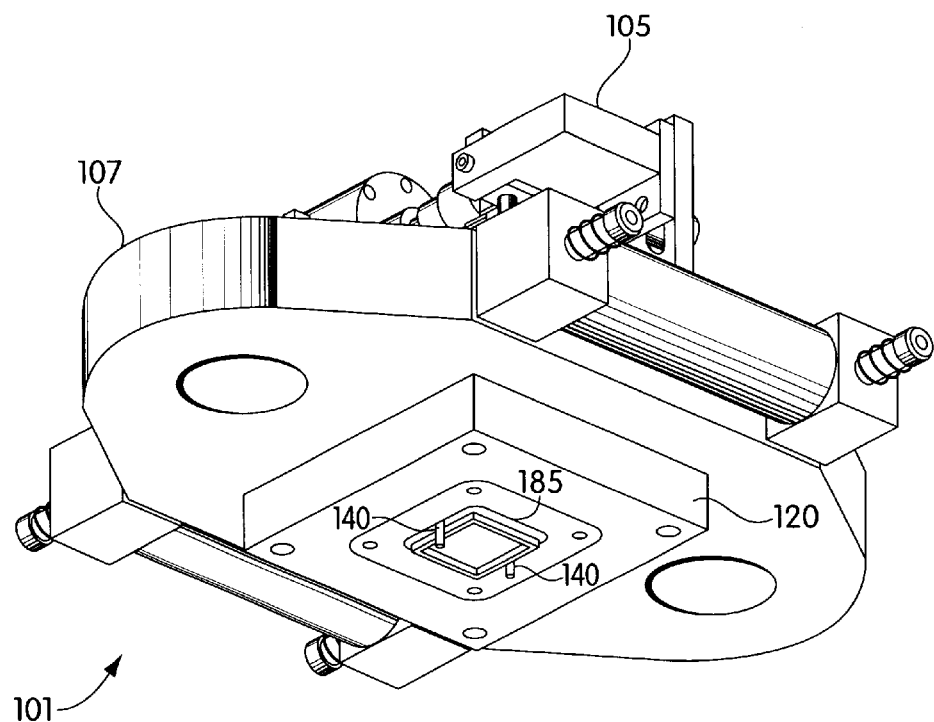
FIG. 12 is a perspective view of the top portion of the system of FIG. 11, looking up from the AA axis.

FIG. 12 is a perspective view of the top portion of the apparatus 101 of FIG. 11, looking up from the AA axis (see FIG. 2). This view shows the injector section 105, top portion 107, the pressure pad 120, and also illustrates the needles 140 in an extended position. In accordance with one embodiment of the present invention, when the needles 140 are in an extended position, they are used to pierce film (not shown) that is disposed adjacent a component being underfilled. By using a needle 140 to create an opening in the film, the opening can form a tight seal around the needle 140, to prevent underfill material on one side of the film from getting through to the other side of the film. For the needles 140 to pierce the film, the top portion 107 is brought towards the bottom portion 111, to close the top and bottom portions 107, 111, respectively, together (see FIG. 14). The piercing of the film is explained more fully further below.

In one embodiment, the pressure pad 120 is structured and arranged to hold the film (not shown in FIG. 12) taut so that the needles 140 can more easily pierce the film. For example, in one embodiment, the pressure pad 120 can be structured to form a "picture frame-like" shape. Similarly, a gasket 185 disposed on the upper surface 107 and through which the needles 140 project, can have a picture frame-like shape, (see also FIGS. 18A and 18B). The gasket 185 has openings sized to fit the needles 140 and helps form a vacuum environment around the component being underfilled. Those skilled in the art will appreciate, however, that the pressure pad 120 and gasket 185 can be formed in virtually any usable shape depending on the component or chip being underfilled.

The pressure pad 120 can be made of any material capable of being used to apply pressure to a film or membrane disposed adjacent to a surface of a component during the encapsulation of the component. For example, the pressure pad can be made of silicon rubber having a durometer ranging from 60 to 70. Other materials having a similar flexibility and hardness also are usable. The gasket 185 can be made of any material capable of forming a seal around the needles 140 and the opening in the film 140 that the needles make and/or pass through, such as 60–70 durometer silicon rubber, plastic, metal, etc.

In another embodiment, when the needles 140 are in an extended position, the needles 140 project through openings that have been previously formed in the film (not shown in FIG. 12). Typically, each opening is sized to fit the needle 140, so that the needle 140 and the opening form a contact tight enough to help prevent underfill material on one side of the film from seeping through to the other side of the film. The gasket 185 also helps to ensure that the underfill material on one side of the film does not contaminate the other side of the film, the apparatus 101, or the portions of the component that are not being underfilled.

The apparatus 101 can be made of any suitable material known to those skilled in the art (e.g., metal, plastic, composite, and the like). The needles 140 can be made of any material, such as stainless steel, capable of projecting through a thin film and maintaining tight contact with an opening in the film through which the needle 140 projects. In one embodiment, the needle 140 is made of a material, such as stainless steel, capable of precisely, quickly, and easily piercing a thin film. In addition, in one embodiment, the needles are hollow, to permit the flow of underfill material through one of the needles 140 onto the component and to permit the flow of air through the other needle 140.

Figure 13:
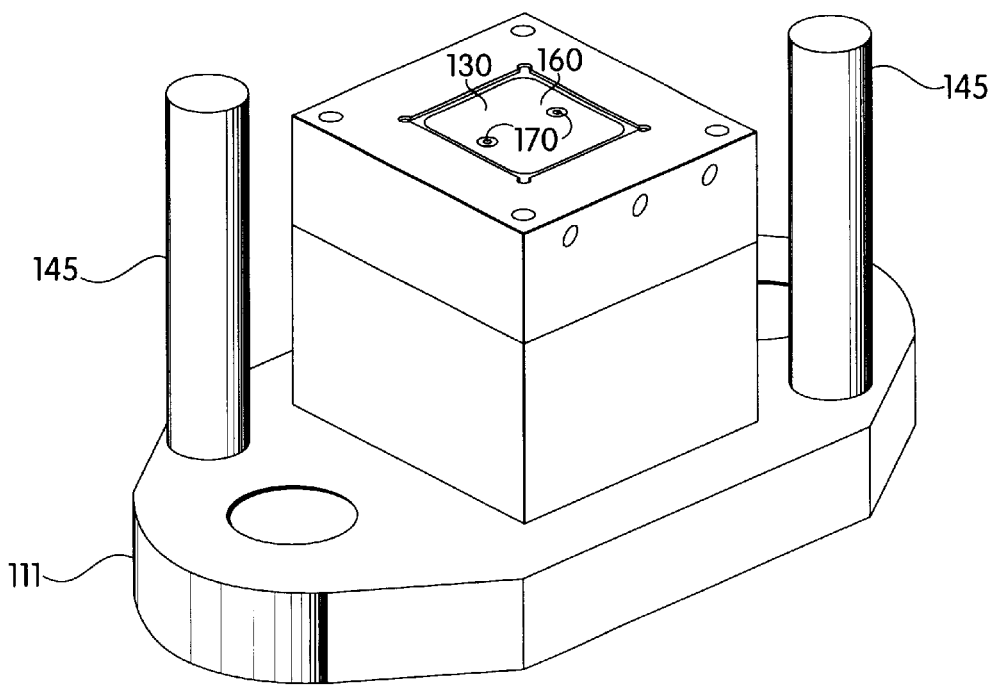
FIG. 13 is a perspective view of the bottom of the system of FIG. 11, looking down from the AA axis.

FIG. 13 is a perspective view of the bottom of the apparatus 101 of FIG. 11, looking down from the AA axis. This view shows the nesting 160 for the component and substrate (not shown) and the die surface 130 against which the pressure pad 120 holds the film so that the film can be pierced. The die surface 130 also includes a pair of openings 170 to receive the needles 140.

Figure 14:
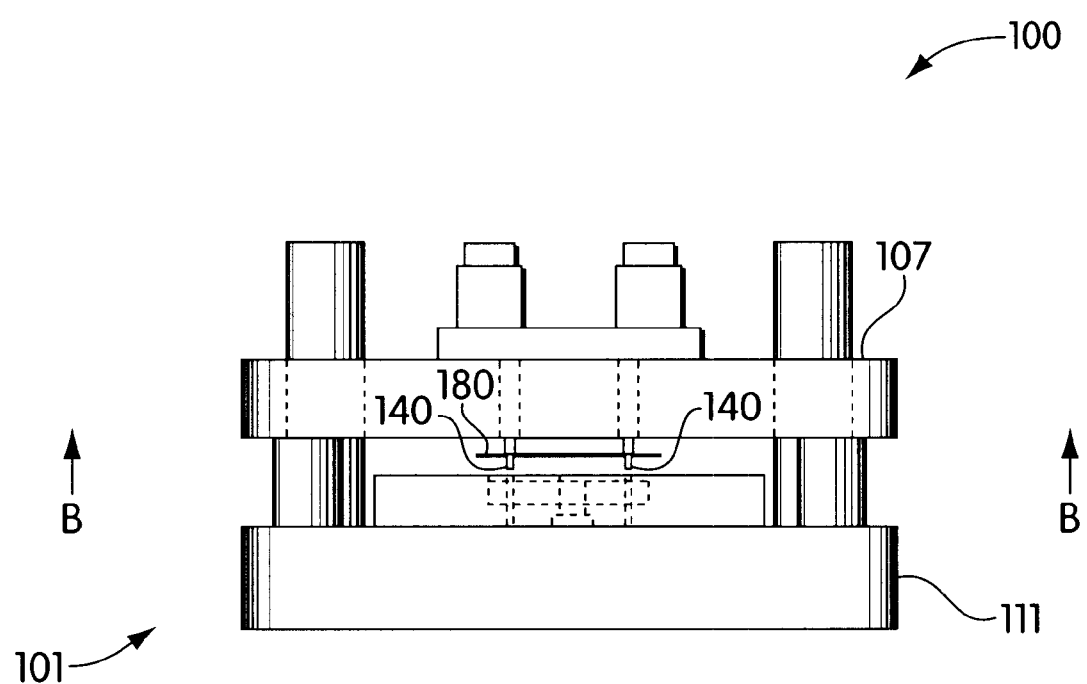
FIG. 14 is a side view illustrating the film in position and the piercing by the needles of the system of FIG. 11.

FIG. 14 is another side view of the apparatus 101, illustrating how the needles 140 pierce a portion of film 180 (note that in the illustrative embodiment, the piercing of film 180 is performed when the component is not positioned in the apparatus 101). The needles 140 pierce the film 180 when the top portion 107 of the apparatus 101 is brought towards the bottom portion 111. As those skilled in the art recognize, there are a number of different ways to cause the needles 140 to pierce the film 180. For example, as illustrated in FIG. 14, the needles 140 can move towards the film 180 when the upper portion 107 is lowered, or the injector portion 105 (FIG. 11) can be lowered, bringing the needles 140 down with it, or the lower portion 111 can be raised towards the needles 140, etc.

In one embodiment, the film 180 is polypropylene film. The film 180 can also be made from other materials, such as plastic, polyvinyl chloride (PVC), and the like. The film 180, which by way of example can be part of a continuous sheet of film or part of an individual portion of film attached to a substrate, is, for piercing, aligned between the top portion 107 and the bottom portion 111 of the apparatus 101. Although not visible in this view, the film 180 effectively is disposed between the pressure pad 120 and the die surface 130.

Figure 15A:
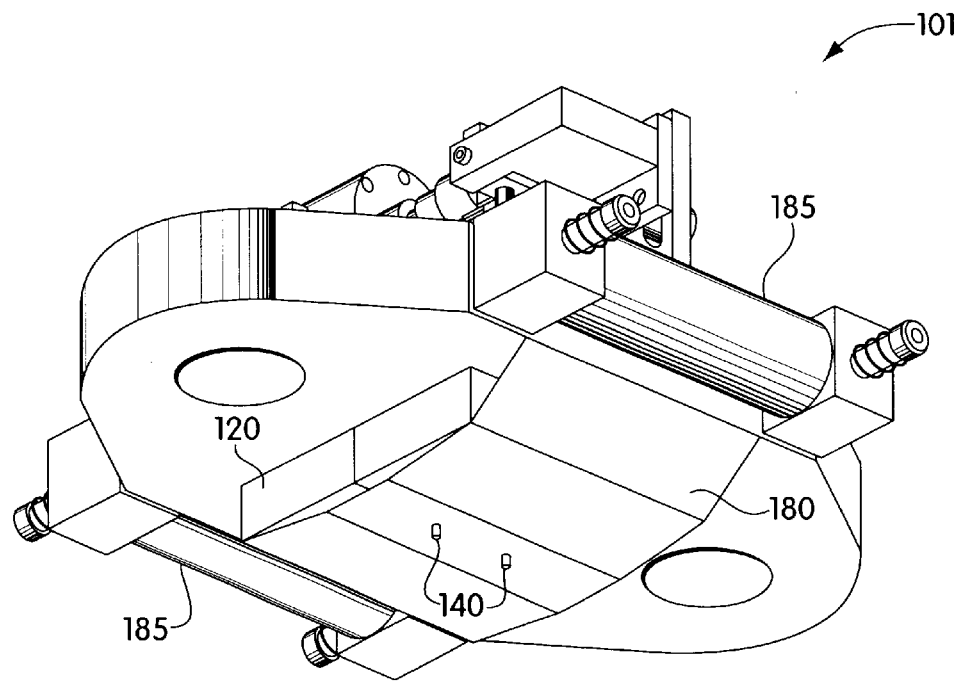
FIGS. 15A and 15B are perspective and side views, respectively, of the top of the fixture of FIG. 14, looking up from the BB axis.

FIG. 15A is a perspective view of the top of the tooling of FIG. 14, looking up from the BB axis. The film 180 can be part of a continuous sheet or roll of film, such as film drawn between a pair of rollers 185. Although the rollers 185 are illustrated in FIG. 15A as part of the apparatus 101, the rollers 185 for the roll of film 180 can be located apart from the apparatus 101. In addition, it will be appreciated that the continuous sheet of film 180 can be provided to the apparatus 101 in many other ways other than by using rollers 185. By using film 180 that is part of a continuous sheet, or that is part of a single sheet of film associated with a particular component being underfilled, a new portion of film 180 is provided for each underfill process. This further helps to ensure cleanliness and non-contamination before, during, and after the underfill process.

FIG. 15A shows the film 180 stretched taut over a pressure pad 120 as it is pierced, and the needles 140 are extended. The pressure pad 120 holds the film 180 taut against the die surface 130 of the bottom portion 111 of the apparatus 101, so that the needles 140 can pierce the film 180 when the apparatus 101 is closed. Referring to both FIGS. 14 and 15A, when the top portion 107 of the apparatus is drawn towards the bottom portion 111, the needles 140 travel down to pierce the film 180. In FIG. 15A, a portion of the film 180 is rolled to a position near the pressure pad 120 so that the needles 140 can pierce the film 180. As FIG. 15A shows, the pressure pad 120 helps to hold the film 180 taut. In this embodiment, the film 180 is unrolled for use during the underfill process, and following underfilling the "used" film is rolled away from the needles 140 and die surface 130 (FIG. 13) of the apparatus 101.

In another embodiment (not shown), the needles 140 pierce an individual sheet of film, such as an individual sheet of film 180 placed onto the substrate containing components being underfilled. The film 180 can be placed onto to the substrate in advance of placing the substrate in the apparatus 101.

In still another embodiment, film 180 is already attached to the substrate containing the component being encapsulated. In this latter embodiment, if the film 180 attached to the component being encapsulated is already substantially taut, the apparatus 101 need not require use of a pressure pad 190 to enable the needles 140 to pierce the film 180. Moreover, in some embodiments where the film 180 already is attached to the substrate, it is not necessary to pierce the film 180 then pull the needles 140 away so that a substrate can be put into the apparatus, as described herein. Rather, in these embodiments, once the needles 140 pierce the film 180, the underfilling process can begin.

In yet another embodiment of the present invention, the component being underfilled is part of a substrate similar to that shown in FIG. 1 and includes top coverlay tape 34 (FIG. 1) having injection holes 33 and vacuum holes 35 already formed in it. In this embodiment, the apparatus 101 does not necessarily require a pressure pad 120 for the piercing of the top coverlay tape 34, although use of the pressure pad 120 can be advantageous to minimize possible movement of the coverlay tape 34 during the underfill process.

Figure 15B:
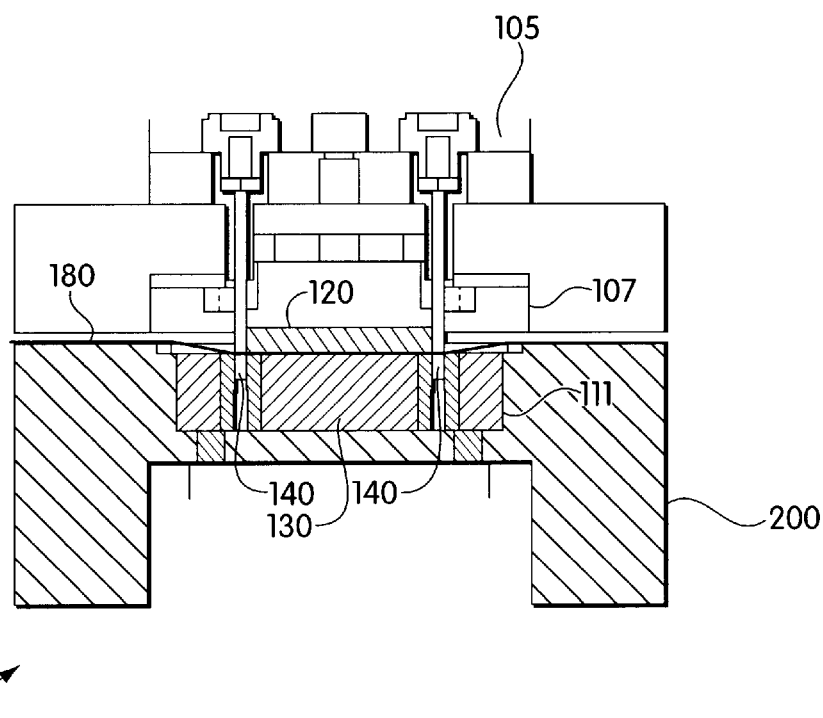

FIG. 15B is a side view of the apparatus of FIG. 15A illustrating the retraction of needles 140 with film 180. The piercing of the film 180 is achieved in part using the pressure pad 120 holding the film 180 taut against the die surface 130 of the bottom portion 111 of the apparatus 101. The top portion 105 of the apparatus 101 closes to bring the gasket 185 (not visible in this figure) into position. When in position, the top portion 107 is brought close enough to the bottom portion 111 to cause the pressure pad 120 to hold the film 180 taut. For film 180 that is part of a continuous sheet of film, the top portion 107 is brought close enough to the bottom portion 111 to also stretch the film 180 slightly, as shown in FIG. 15A. The gasket 185 helps form a vacuum and the pressure pad 180 holds and stretches the film 180 so that the needles 140 can travel down to pierce the film 180. The top portion 105 of the apparatus 101 is then opened (see FIG. 17) and the apparatus 101 is ready to receive a substrate with components (not shown) for processing.

Figure 16:
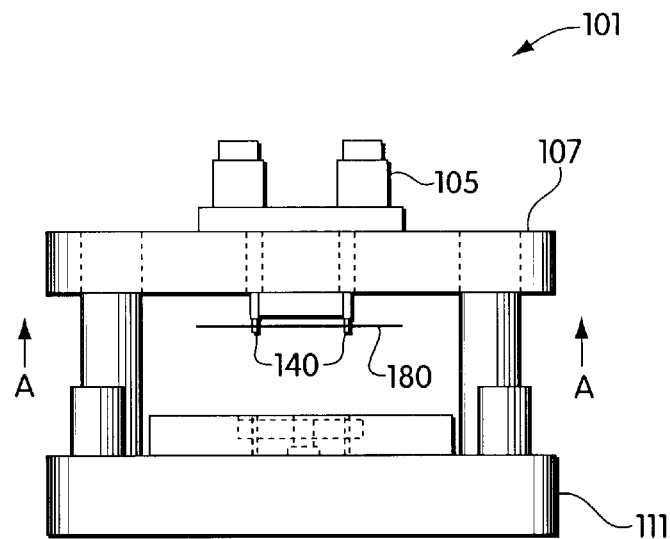
FIG. 16 is a side view illustrating the retraction of needles with film attached of the system of FIG. 11.

FIG. 16 is a side view of FIGS. 15A–15B after the needles 140 have pierced the film 180 and illustrates the retraction of the needles 140 with film 180 attached. FIG. 16 is a representation of an embodiment of the present invention where the film 180 is not part of a continuous sheet of film, but rather is an individual sheet of film 180. In this view, after the needles 140 pierce the film 180, the apparatus 101 is opened, so that the needles 140 are retracted with the film 180 attached. Those skilled in the art, however, will understand that, in embodiments where the film 180 is part of a continuous sheet, the retraction of the needles 140 with film 180 attached will look similar to FIG. 16.

Figure 17:
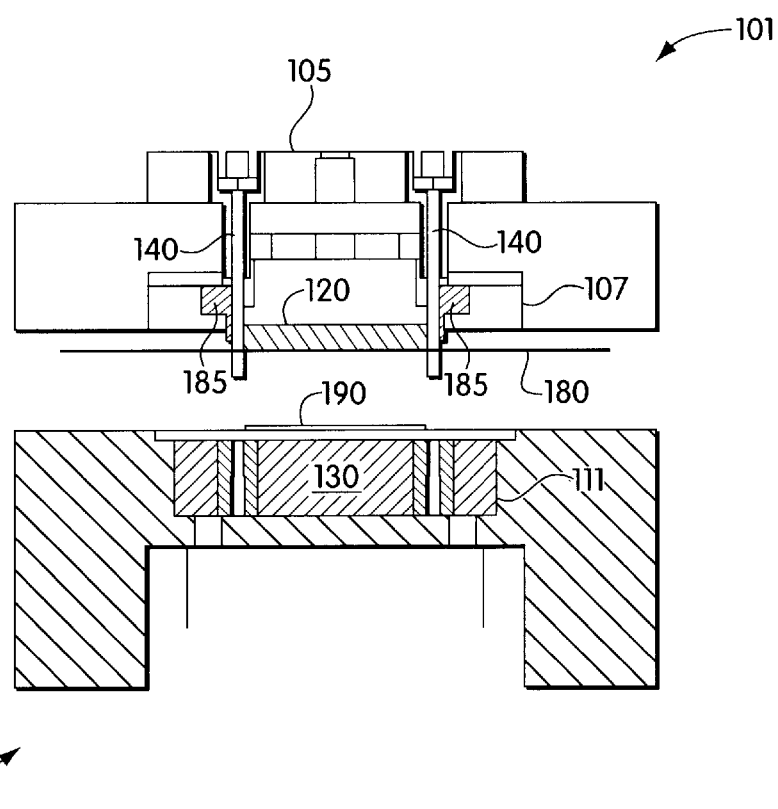
FIG. 17 is another side view illustrating the retraction of needles with film attached of the system of FIG. 11, showing a component loaded for the start of the process.

FIG. 17 is a side view of the start of the underfilling process, after the film 180 is pierced. In this view, the film 180 is pressed against the pressure pad 120, and the needles 180 are projecting about 0.130 mils below the film 180. It should be understood, however, that the needles 140 can project through the film 180 by any distance that is appropriate for the size of the component or chip (not shown) being underfilled, the substrate to which the component is attached, and/or the particular configuration of the apparatus 101. In FIG. 17, a substrate 190 (which is carrying one or more components (not shown) to be underfilled) has been loaded for underfill processing. FIG. 17 also illustrates a cross-sectional view of the gasket 185, which is used during the underfill process to help stretch and hold tight the film 180 and form a tight seal around the needles 140.

Referring to FIGS. 14 through 17, although these Figures show piercing of film 180 using a single apparatus 101, those skilled in the art will recognize that embodiments of the present invention can be implemented using a plurality of apparatuses 101. For example, in one embodiment, the film 180 is part of a continuous sheet of film that is routed to a plurality of apparatuses 101 simultaneously (e.g., such as the arrangements of FIGS. 5 and 7), such that each apparatus 101 pierces different portions of the same sheet of film 180. This configuration enables many components to be underfilled at the same time, while still maintaining the clean, non-contaminated conditions advantageously achieved using the present invention.

Once the film 180 has the appropriate openings made in it to receive the needles 140 (whether these openings are already in the film 180 or whether they are made in the film as shown in FIGS. 14 through 17), the apparatus 101 can be closed around the substrate carrying the component(s) being underfilled, and the underfill process can proceed as described below.

Figure 18A:
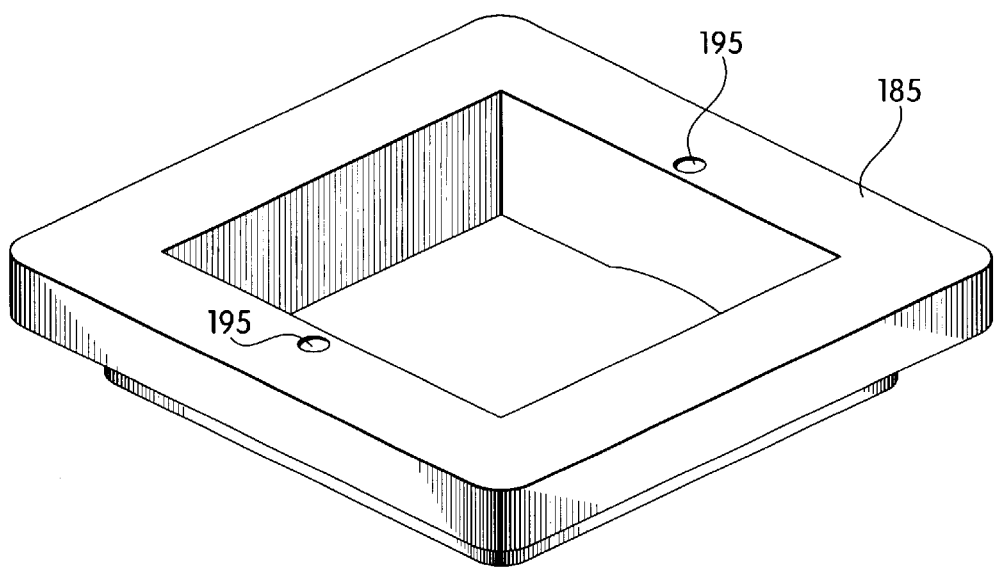
FIGS. 18A and 18B are top and bottom perspective views, respectively, of a gasket used in accordance with one embodiment of the invention.
Figure 18B:
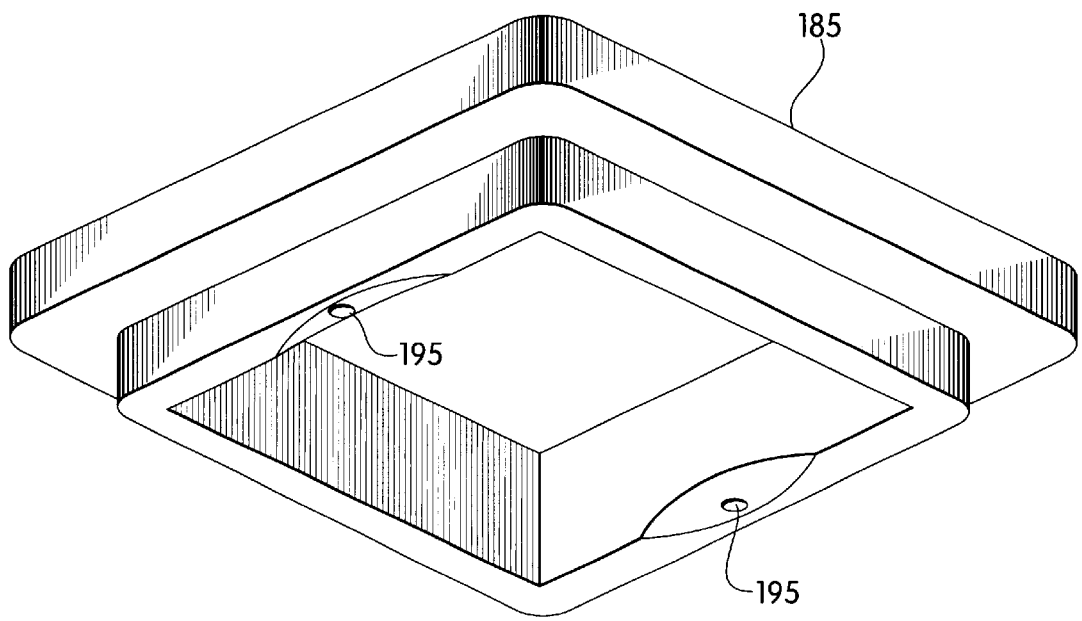

FIGS. 18A and 18B are top and bottom perspective views, respectively, of the gasket 185 of FIGS. 12 and 17. In the illustrated embodiment, the gasket 185 has a pair of holes 195 for receiving the needles 140 (not illustrated in this view) during the underfill process. Like the pressure pad 120, the gasket 185 can be made of any material capable of being used to create a vacuum and apply pressure to a film or membrane disposed adjacent to a surface of a component during the underfilling of the component. For example, the gasket 185 can be made of silicon rubber having a durometer ranging from 60 to 70. Other materials having a similar flexibility and hardness also are usable.

Figure 19:
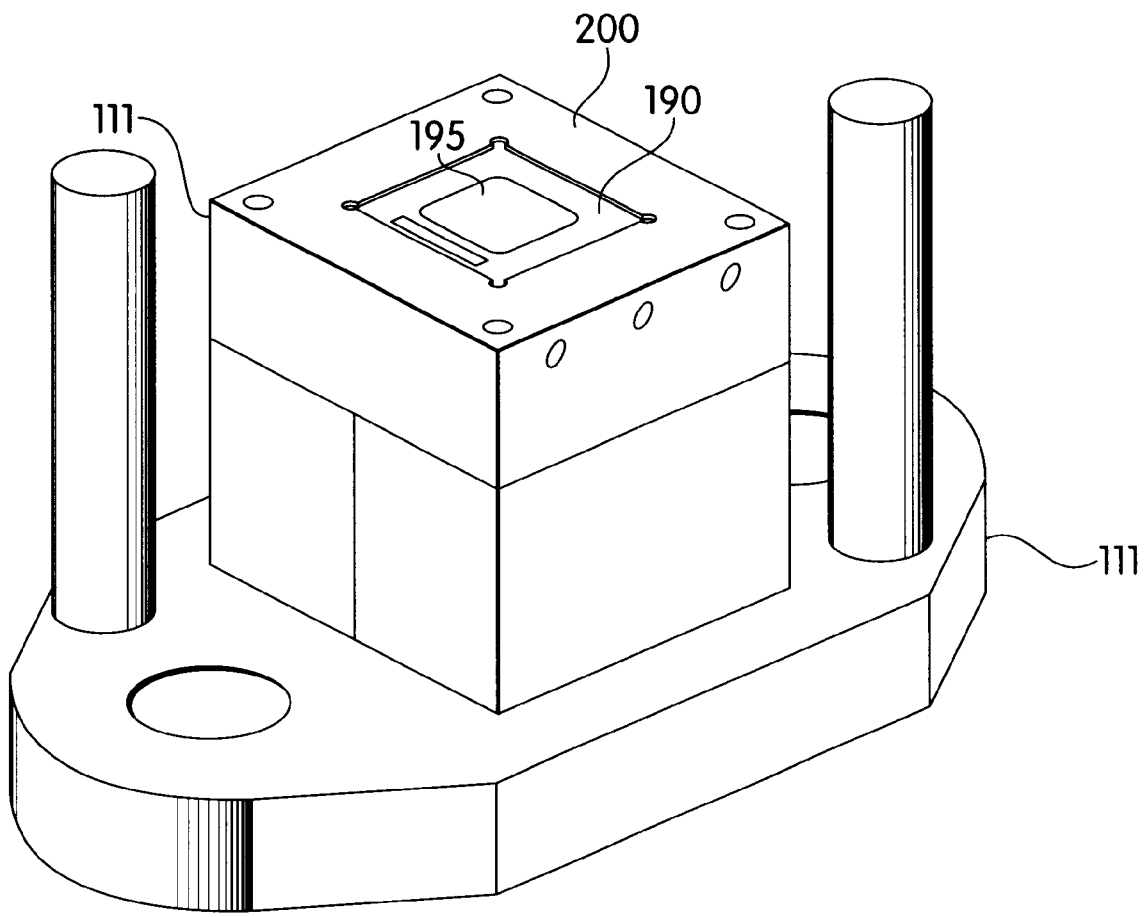
FIG. 19 is a perspective view of the bottom of the fixture of FIG. 14, looking down from the BB axis.

FIG. 19 is a perspective view of the bottom of the apparatus 101 of FIG. 14, looking down from the BB axis. In this view, a substrate 190 carrying chips 190 to be underfilled, is disposed in the nest area 200 and is ready for the underfill process.

Figure 20A:
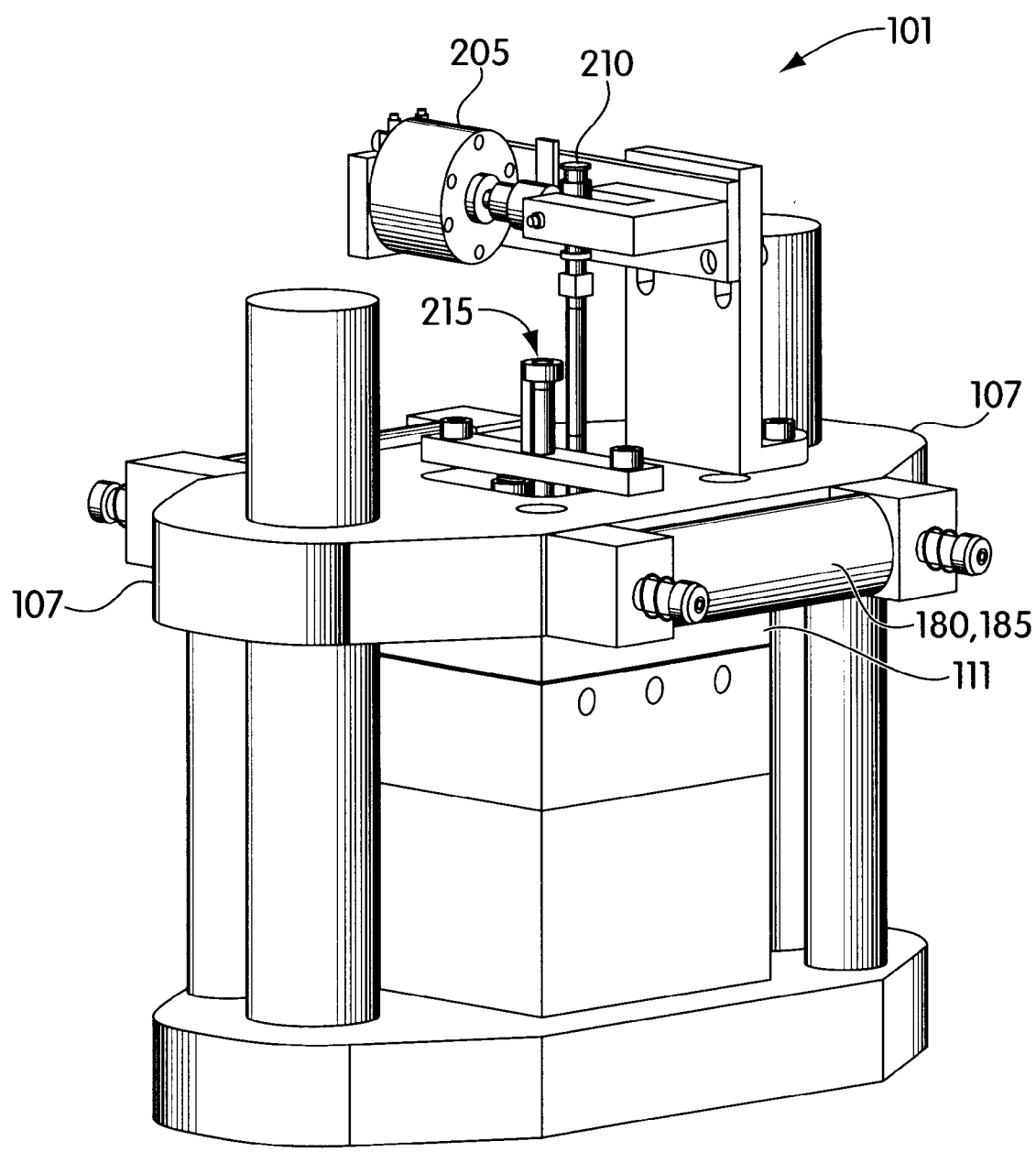
FIGS. 20A and 20B are perspective views of the fixture of FIG. 14, in a closed position.
Figure 20B:
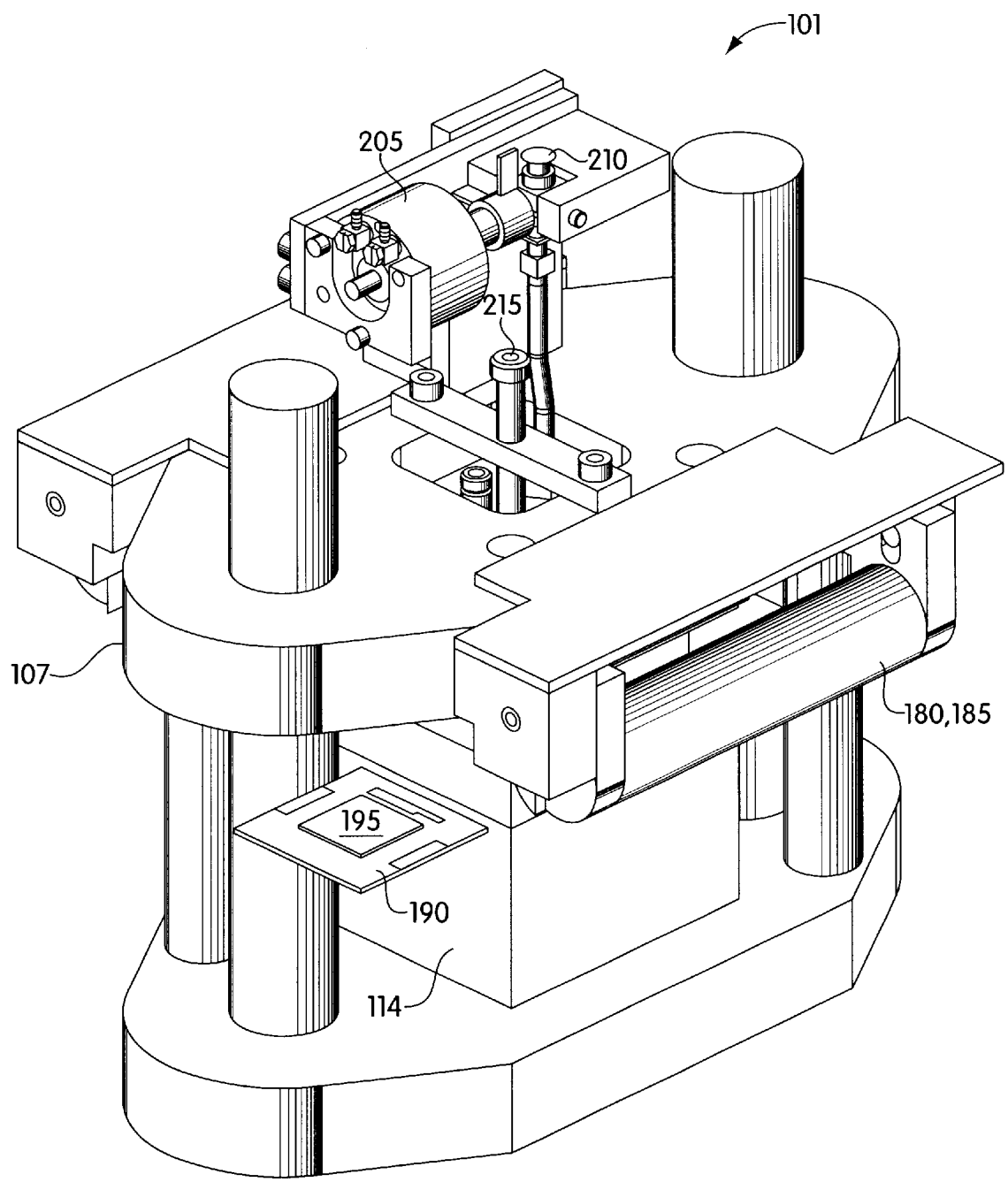

FIGS. 20A and 20B are perspective views of the apparatus 101 of FIG. 14 in a closed position. In both FIG. 20A and FIG. 20B, the top 107 and bottom 111 portions of the apparatus 101 are shown as they appear when the apparatus 101 is closed. In this embodiment, the roll of film 180 is shown as part of the apparatus 101 and is disposed alongside the upper portion of the apparatus 101. However, it will be appreciated that the roll of film 180 need not actually be located as shown in FIG. 20A, but can be located anywhere (including outside of the fixture) so long as the film 180, when unrolled, can be positioned within the apparatus 101 and pierced by the needles 140, as described herein.

A rotator 205 (shown in both FIGS. 20A and 20B), such as a cam, can be used to raise and lower the top part of the fixture 100, so that substrates 190 carrying components 195 to be processed can be inserted into the apparatus 101. Those skilled in the art will appreciate that many other types of mechanisms can be used to raise and lower the top portion 107 of the apparatus 101 and/or the needles 140. FIGS. 20A and 20B also illustrate the injection location 210 where underfill material is provided to the apparatus 101 via a needle 140 and a vacuum location 215 where a air is drawn through a separate needle 140. The systems and methods described previously (in connection with FIGS. 1 through 10) for injecting material and drawing it through the substrate, are applicable to this aspect as well.

In addition, FIG. 20B also shows the approximate place in the apparatus 101 where a substrate 190 carrying one or more components 195 to be processed could be inserted so that the substrate 190 can be placed within the apparatus 101, as shown in FIGS. 17 and 19.

Figure 21A:
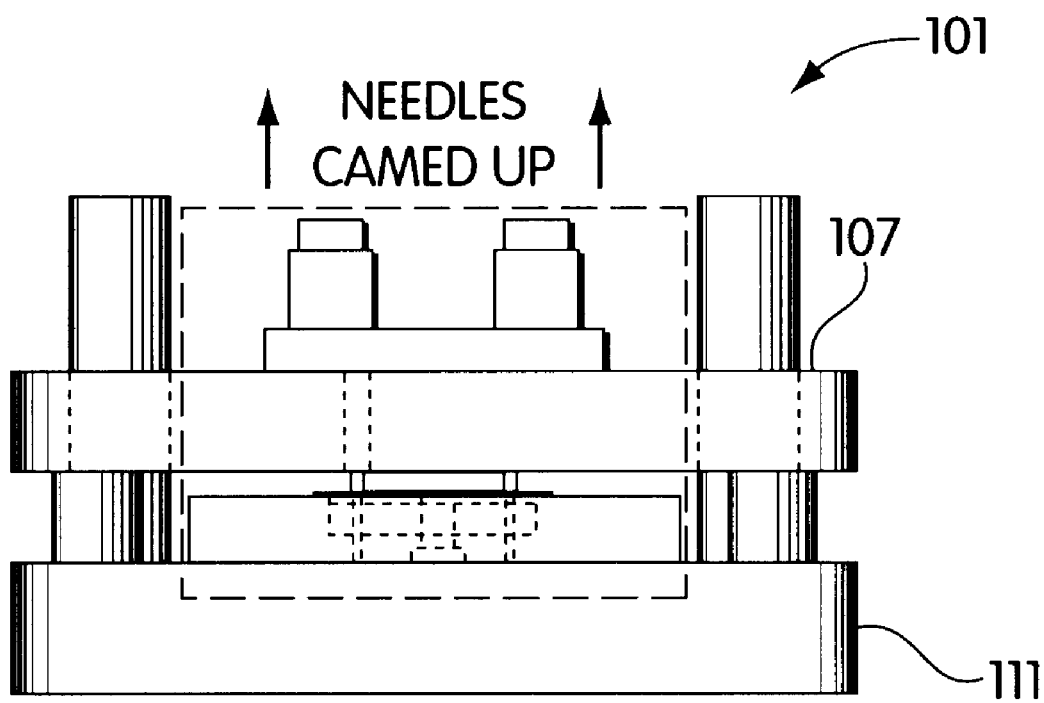
FIGS. 21A and 21B are side views illustrating one step of the dispense cycle for the system of FIG. 11.

FIG. 21A is a side view illustrating the dispense cycle for the apparatus 101 of FIG. 11. In this view, the top portion 107 of the apparatus 101 has been closed and the needles 140 are moved to the correct position for dispensing underfill material (not shown) or other material. When the needles 140 contact the substrate (not shown) below the component (not visible in this view), the spring-loading on the needles 140 permit them to travel upwards to the underfill position. In one embodiment, the needles 140 project about 0.033 mils below the film 180 before they contact the substrate on which the component or chip (not visible in FIG. 21A) to be underfilled is located.

Figure 21B:
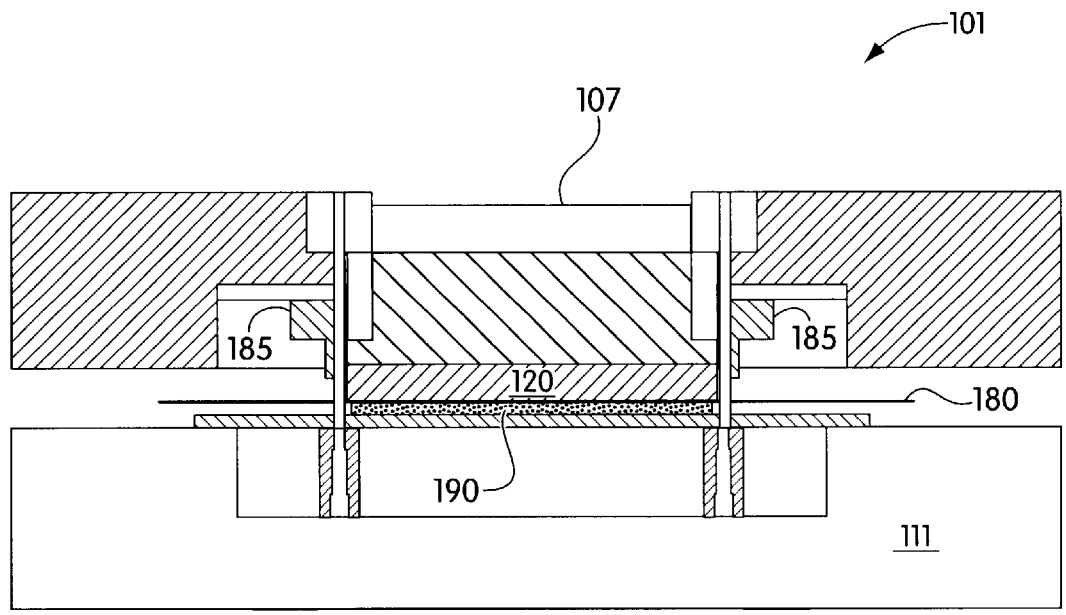

FIG. 21B shows a close-up view of the dotted portion of FIG. 21A. In FIG. 21B, the pressure pad 120 closes down to seal the film 180 onto the top surface of a substrate 190 containing components to be underfilled. Although not visible in this figure, the needles 140 (which prior to dispensing were projecting through the film 180) contact the surface of the substrate on which the chip die 190 is disposed and start to travel upwards (via spring loading) from their position projecting below the film 180 to a dispensing position.

Figure 22:
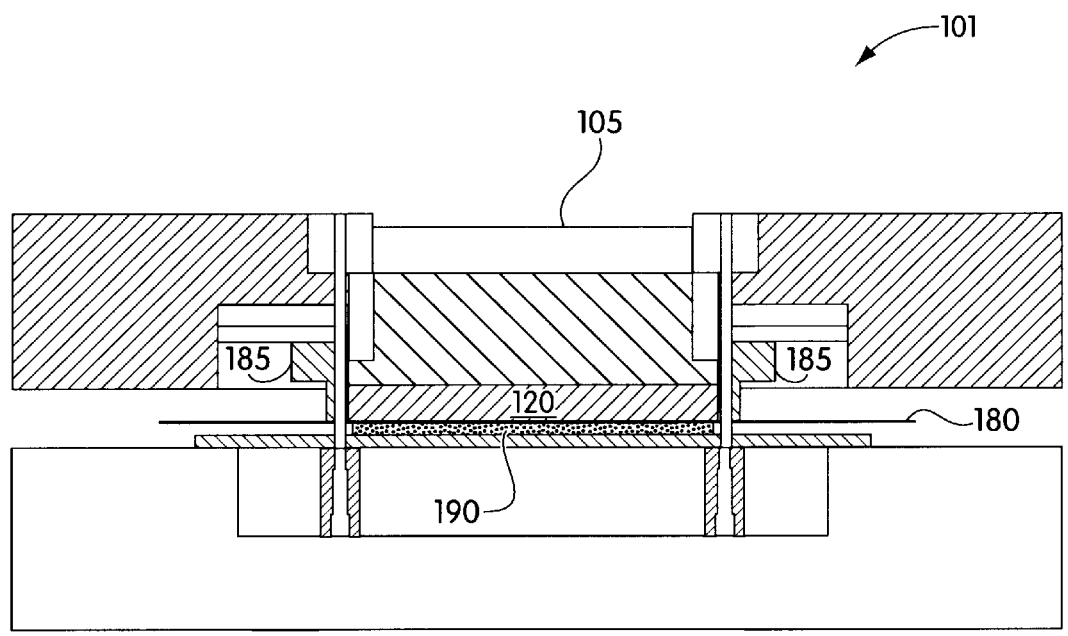
FIG. 22 is a side cross-sectional view illustrating one step of the dispense cycle for the system of FIG. 11.

FIG. 22 is a side cross-sectional view illustrating another step of the dispense cycle for the apparatus 101 of FIG. 11. The gasket 185 is contacting the top of the film 180, while the pressure pad 120 holds the film 180 in place. The needles 140 (not visible in this figure) remain below the film 180, but are still traveling upwards. Although the pressure pad 120 is not visible in this view, the gasket 185 and the pressure pad are 120 positioned relative to the film 180 such that the film 180 is substantially straight and is not substantially stretched or bent.

Figure 23:
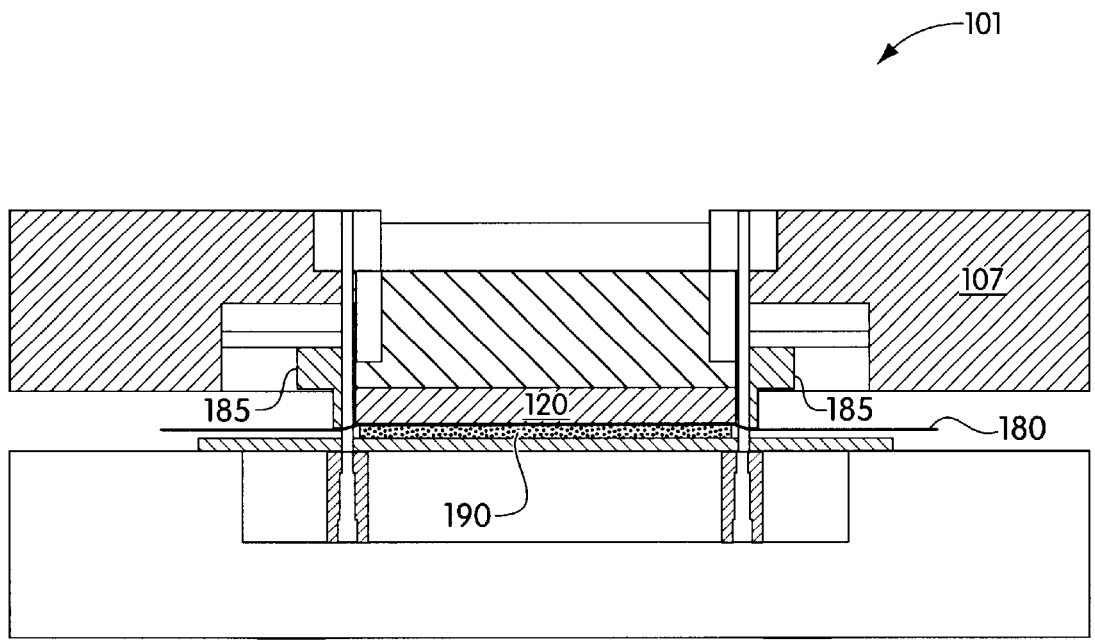
FIG. 23 is a side cross-sectional view illustrating another step of the dispense cycle for the system of FIG. 11.

FIG. 23 is a side cross-sectional view illustrating another step of the dispense cycle for the apparatus 101. In this step, the gasket 185 has moved past the surface of the pressure pad 120 (visible in this figure by outline) by a predetermined distance, to extend or stretch a portion of the film 180. For example, the gasket 185 can travel past the surface of pressure pad 120 by about 0.011 mils. As this figure shows, the portions of the film 180 adjacent to the edges of component 190 are being extended from the point adjacent to the pressure pad 120 towards the bottom edge of the gasket 195. By extending the film 180 as shown in this figure, the pressure pad 120 and gasket 185 ensure that the bottom portion 111, the substrate for the component 130, and other parts of the apparatus 110 are protected from contamination by the material being injected. This helps the film 180 to form a better seal around the component 190, to prevent the material being injected from escaping. The angle of the film 180 also helps the underfill material being dispensed to form a proper shape around the edges of the substrate 190 and its components 195 (not visible in this Figure).

In FIG. 23, although the needles 140 are not visible in the figure, the needles 140 are still below the film 180 and moving upward by the substrate 190 holding the component 195 to be underfilled. In this embodiment, the needles 140 will move upward by a distance sufficient to put the needles 140 in a proper position for dispensing material (not shown) for the process being performed. For example, the needles 140 might move upwards to a first position for injecting material to underfill the component 195 on the substrate 190 and to a second position for injecting material to encapsulate the component 195. In FIG. 23, the apparatus 101 is not yet fully closed.

Figure 24:
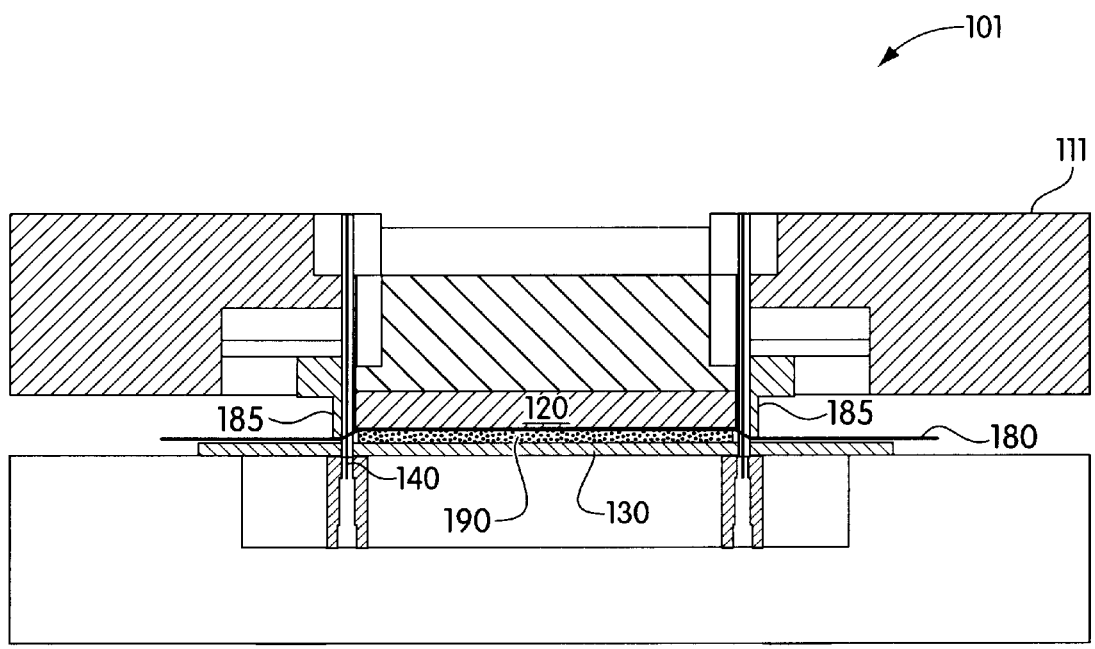
FIG. 24 is a side cross-sectional view illustrating another step of the dispense cycle for the system of FIG. 11.

In FIG. 24, the gasket 185 has continued to travel past the surface of the pressure pad 120, to continue extending the film 180. In this figure, the gasket 185 has traveled about 0.020 mils below the surface of the pressure pad 120. As FIG. 24 shows, the needles 140 are still below the film 180 and continue to move upward, by the edge of the substrate on which the component 190 is disposed. The apparatus 101 is still not yet fully closed.

Figure 25:
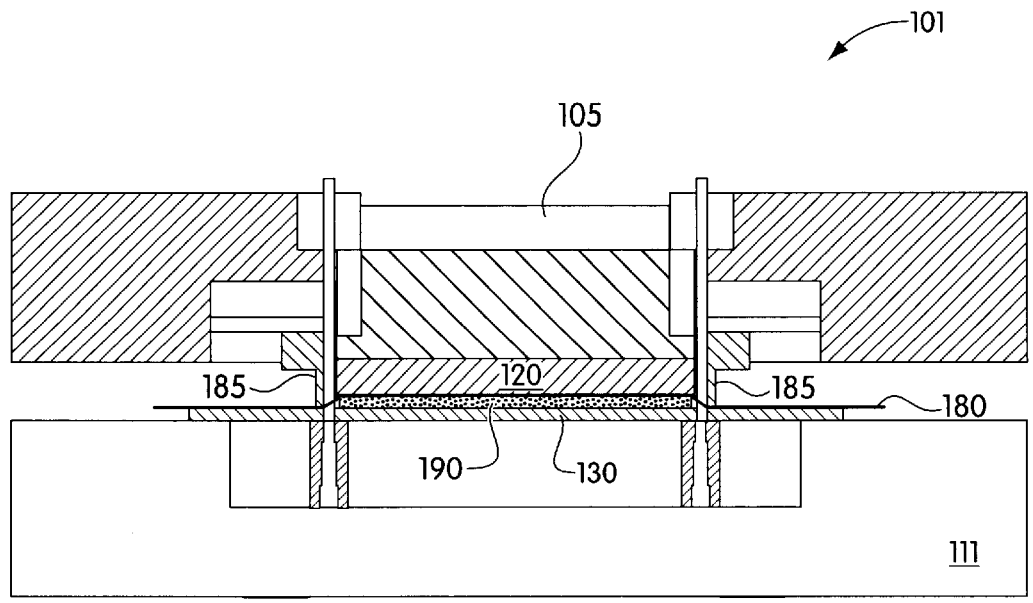
FIG. 25 is a side cross-sectional view illustrating another step of the dispense cycle for the system of FIG. 11, when the tooling of the fixture is fully closed.

In FIG. 25, the apparatus 101 is fully closed, and the needles 140 (not visible in this figure) have been retracted to a proper position for the dispense cycle. Note that the apparatus 101 in one embodiment is closed manually, such as by physically moving the top portion 107 towards the bottom portion 111. In another embodiment, movement of a rotator 205 (FIGS. 20A and 20B) closes the apparatus 101. The rotator 205 can be actuated manually or can be actuated automatically, by apparatus well known to those skilled in the art.

Figure 26:
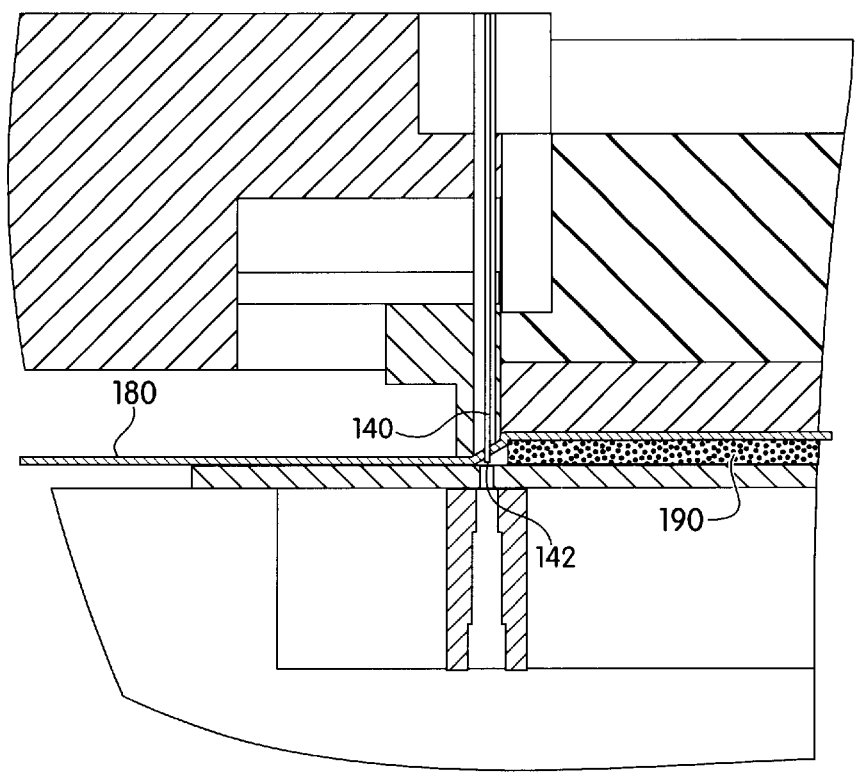
FIG. 26 is a close up view of a portion of FIG. 25.

FIG. 26 is a close up view of a portion of the apparatus shown in FIG. 25. This view shows how the movement of the gasket 195 has stretched the film 180, and how the needles 140 (see the tip of the needle 142) are below the barrier formed by the film 180 when injection of material is occurring. Referring to FIGS. 25 and 26, because the needles 140 that dispense underfill material are surrounded by the film 180 and remain below the barrier formed by the film 180, excess underfill material flowing out of the needles 140 is prevented from contaminating surfaces and areas outside of the component 190, such as the top and bottom portions of the apparatus 101, the die surface 130 (FIG. 11), and the pressure pad 120. In addition, keeping the needles 140 below the barrier formed by the film 180 helps insure proper flow of the material being injected.

After a component 190 is underfilled with encapsulant, the film 180 can be rolled away from the die surface 130 (FIG. 25), taking away with it any excess underfill material, which sticks to the film 180. For example, the film 180 can be rolled away from the apparatus 101 and onto another roller, such as a take up reel. In that manner, excess underfill material can be "rolled away" from the chip by rolling away the film 180 that helped to "trap" the underfill material.

Figure 27:
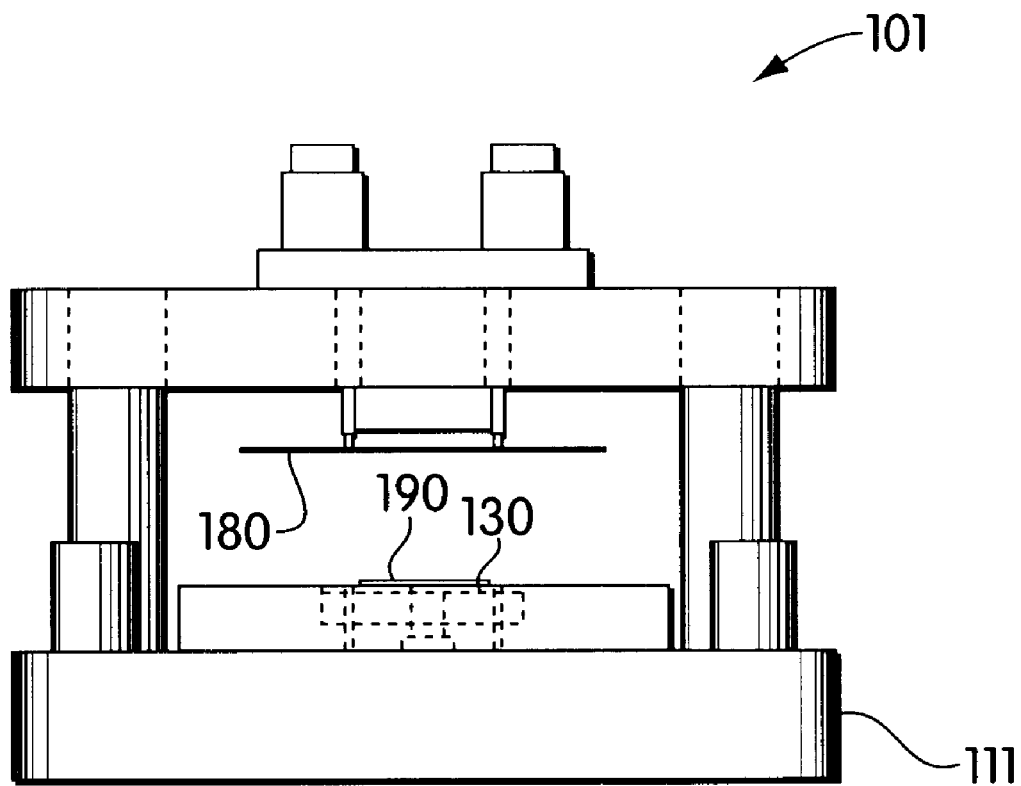
FIG. 27 is a side cross-sectional view of the system of FIG. 11 after dispensing is complete.

In one embodiment of the present invention, the film 180 is physically removed from the apparatus 101, as shown in FIG. 27, when the apparatus is opened after underfilling is complete. This step can occur, for example, in an embodiment using film 180 that is not part of a continuous roll.

When the cycle of dispensing underfill material (which is described more fully below for one embodiment of the invention) is complete, the "used" portion of film is removed from the die surface 139. The dispensing process can then be restarted, and when a subsequent substrate 190 carrying components 195 to be underfilled is inserted into the apparatus 101 for underfilling, the apparatus 101 will be substantially clean and free of underfill material. In addition, components 195 that were underfilled also will be substantially clean and free of underfill material in areas (such as the top of the component 195) where there should be no underfill material.

Thus, the systems, apparatuses, and methods of the invention achieve at least the following desirable results: (1) less maintenance and cleaning of the apparatus 101 is required; (2) the speed of the manufacturing process is increased because it is not necessary to interrupt the manufacturing process to clean the apparatus 101; (3) the quality of the underfilling and/or encapsulation of the component is improved, because the component will be touching clean fixture surfaces and thus will not come into contact with the excess underfill material or encapsulant; and (4) less cleaning of the component (and substrate carrying it) is required after the underfill process is complete, because the substrate and component have contacted fewer contaminated surfaces within the fixture. Using the system and methods of the present invention, the injecting process need not be stopped to clean the apparatus 101, the substrate 100, or the component 195. Instead, any excess material that was injected material "clings" to the film 180 and can be removed simply by removing the film 180. In embodiments of the invention where the film 180 is already attached to the substrate 190 prior to inserting the substrate 190 into the apparatus 101, the excess injected material on the film is removed when the film 180 eventually is removed from the substrate 190.

Figure 28:
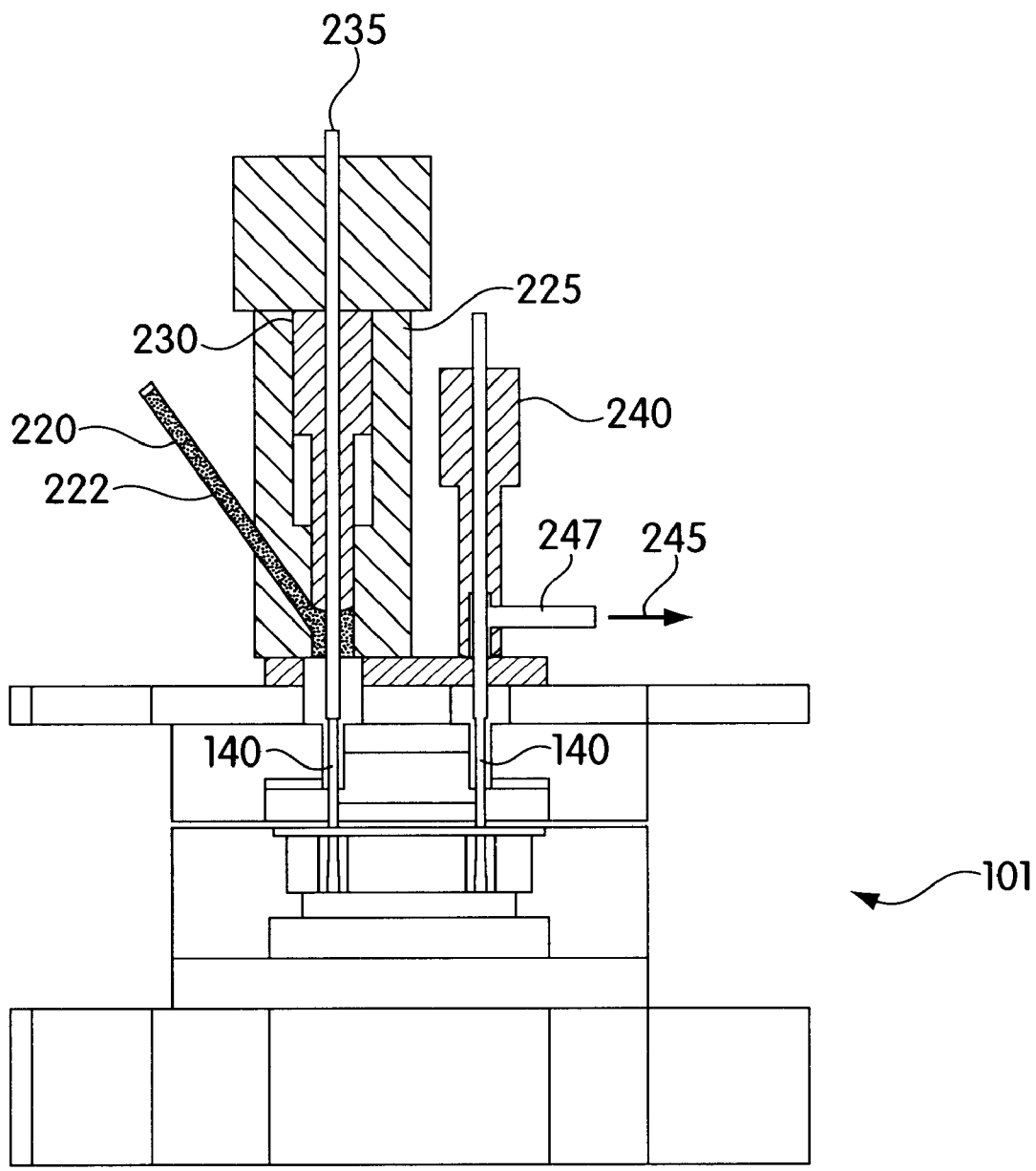
FIG. 28 is a side cross-sectional view of a system and process for underfilling components with a thermal material, in accordance with one embodiment of the invention.

During injection, various types of underfill material can be used in accordance with the present invention. In one embodiment, the underfill material comprises a thermal material, such as pellets 220 of an underfill material that liquefies upon the application of heat, such as epoxy molding compound (EMC) or molded underfill (MUF). FIG. 28 illustrates a system and process in accordance with one embodiment of the present invention for underfilling components with a thermal material using the apparatus 101 of FIGS. 11–27. Throughout the description of FIGS. 28–31, it should be understood that the various actions that occur (e.g., opening and shutting valves, inserting material, and the like) can be performed manually or automatically. It should also be understood that FIGS. 28–31 depict a process in which the use of the film 180 of FIGS. 11–27 is not necessarily required, although some embodiments of the present invention are implemented using film, as well.

The apparatus 101 of FIG. 28 heats pellets 220 that it receives to a liquid material. The apparatus 101 pressure dispenses the liquefied pellets 220 through needles 140 so that the material can be used for void-free encapsulation and/or underfilling of components such as flip chips. The apparatus 101 includes a material input 222 for receiving encapsulant material, such as pellets of material and a heater unit 225 that heats the pellets 220 until the pellets become liquid. The apparatus 101 also includes an injection piston 230 controlling the injection of underfill material, a shut-off valve, 235 controlling the flow of pellets 220 into and out of the heating unit 225, a vent/vacuum shut-off valve 240 that opens to assist the apparatus 101 in drawing a vacuum on a component being processed, and a vent/vacuum output 247, through which a vacuum 245 is drawn.

After the component being underfilled is properly positioned and sealed into the apparatus 101, the non-liquid pellets 220 are fed into the heater unit 225. The shut-off valve 235 is closed and the injection piston 230 is put into a retracted position, to permit the desired quantity of pellets 220 to be fed into the apparatus 101. When the pellets 220 are loaded into the apparatus 101, the heater unit 225 heats the pellets until they are liquefied. The shut-off valve 235 opens to allow the liquefied pellets 220 to be injected by the injection piston 230 into a process area on the component being underfilled.

At approximately the same time that the shut-off valve 235 opens, the vent-vacuum valve 240 opens to activate the assisted venting of air out of the vent/vacuum output 247. In one embodiment of the present invention, the venting of air is "assisted" by a vacuum injection system, such as that shown and described in connection with FIG. 2.

Figure 29:
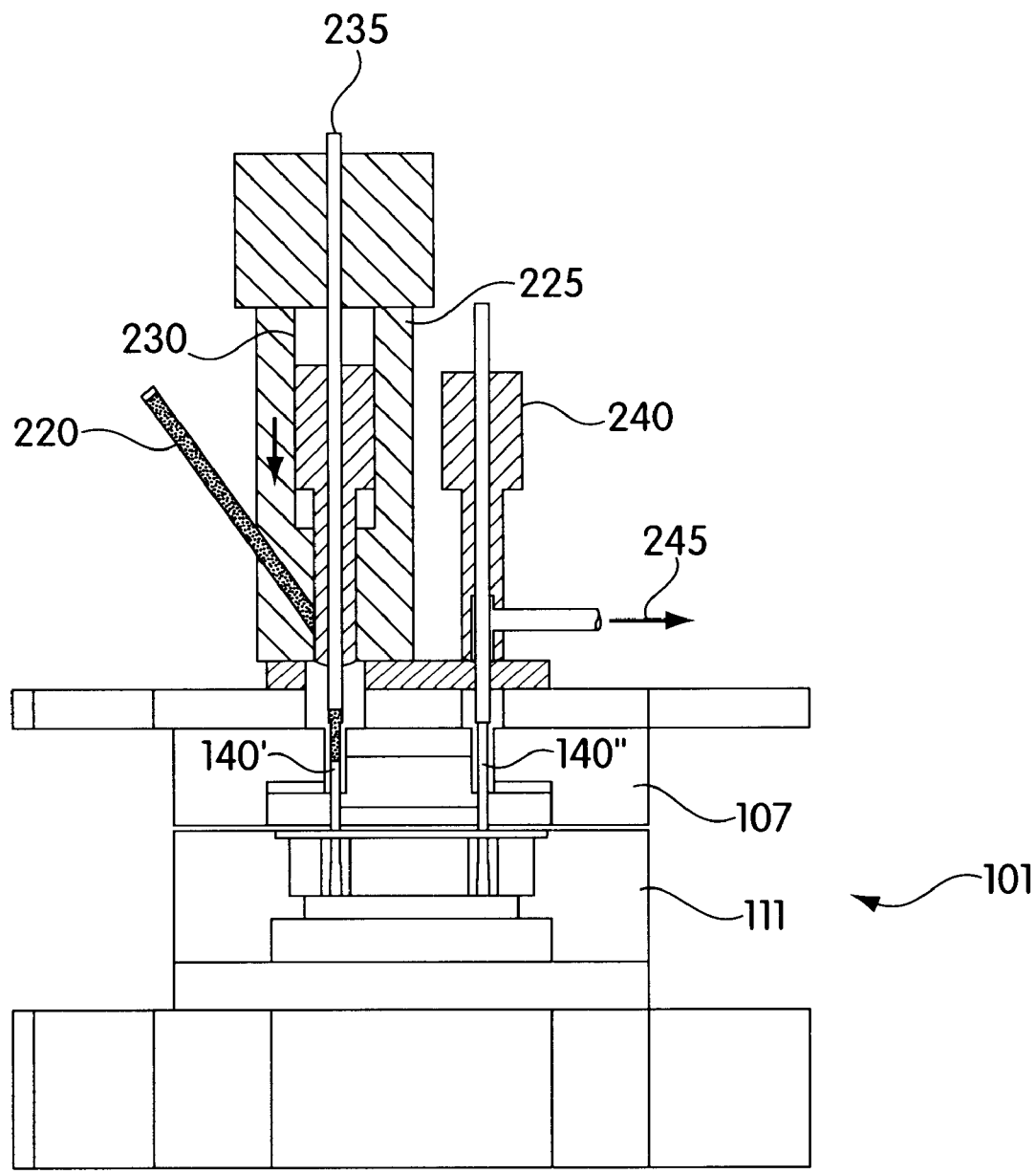
FIG. 29 illustrates the system and process of FIG. 28 during the dispensing of the thermal material, in accordance with one embodiment of the invention

FIG. 29 illustrates the system and process of FIG. 28 during the dispensing of the liquefied pellets 220. When the pellets 220 have been liquefied, the shut off valve 235 opens to allow an injection piston 230 to cycle down to dispense the liquefied pellets 220 under pressure, through the dispensing needle 140', so that the now-liquid pellets 220 (which comprise the underfill material) can flow under the components to be underfilled. During the dispensing of the liquefied pellets 220, a vent/vacuum valve 240 opens, to draw air from the area on the component being underfilled, using a vent/vacuum 245. As described previously in connection with FIGS. 1–10, the venting of air from the area on the component being underfilled assists in the flow of the liquefied pellets 220 through the underfill area, and helps ensure fewer voids in the underfill material.

Figure 30:
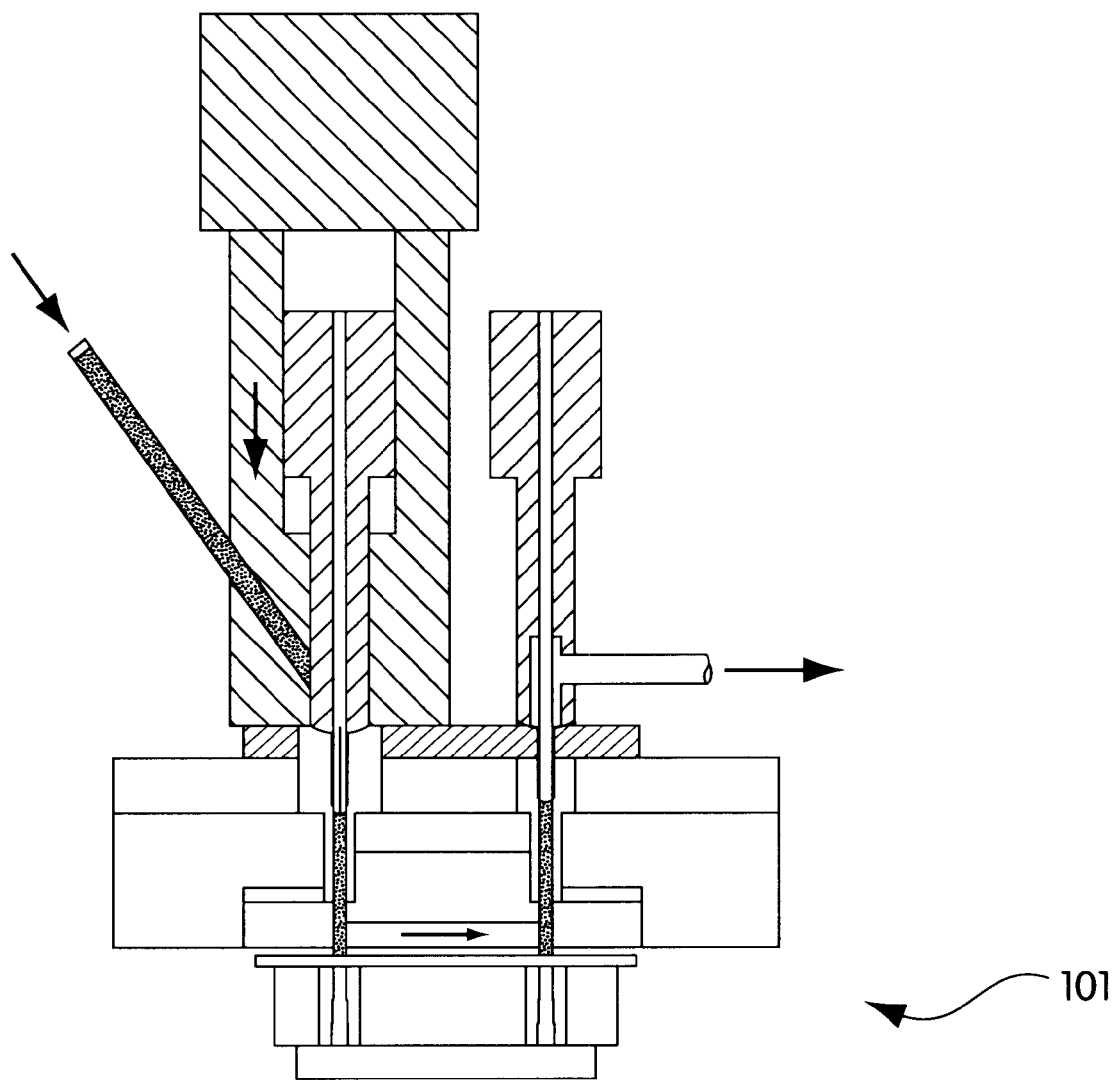
FIGS. 30 and 31 is an illustration of the flow of the underfill process of FIGS. 28 and 29, during underfilling, in accordance with one embodiment of the invention.

FIG. 30 is an illustration of the flow of the underfill process of FIGS. 28 and 29, during underfilling. FIG. 30 shows the direction of flow of pellets into the apparatus 101, the flow direction of underfill material to the component being underfilled, and the flow direction of the vent/vacuum.

Figure 31:
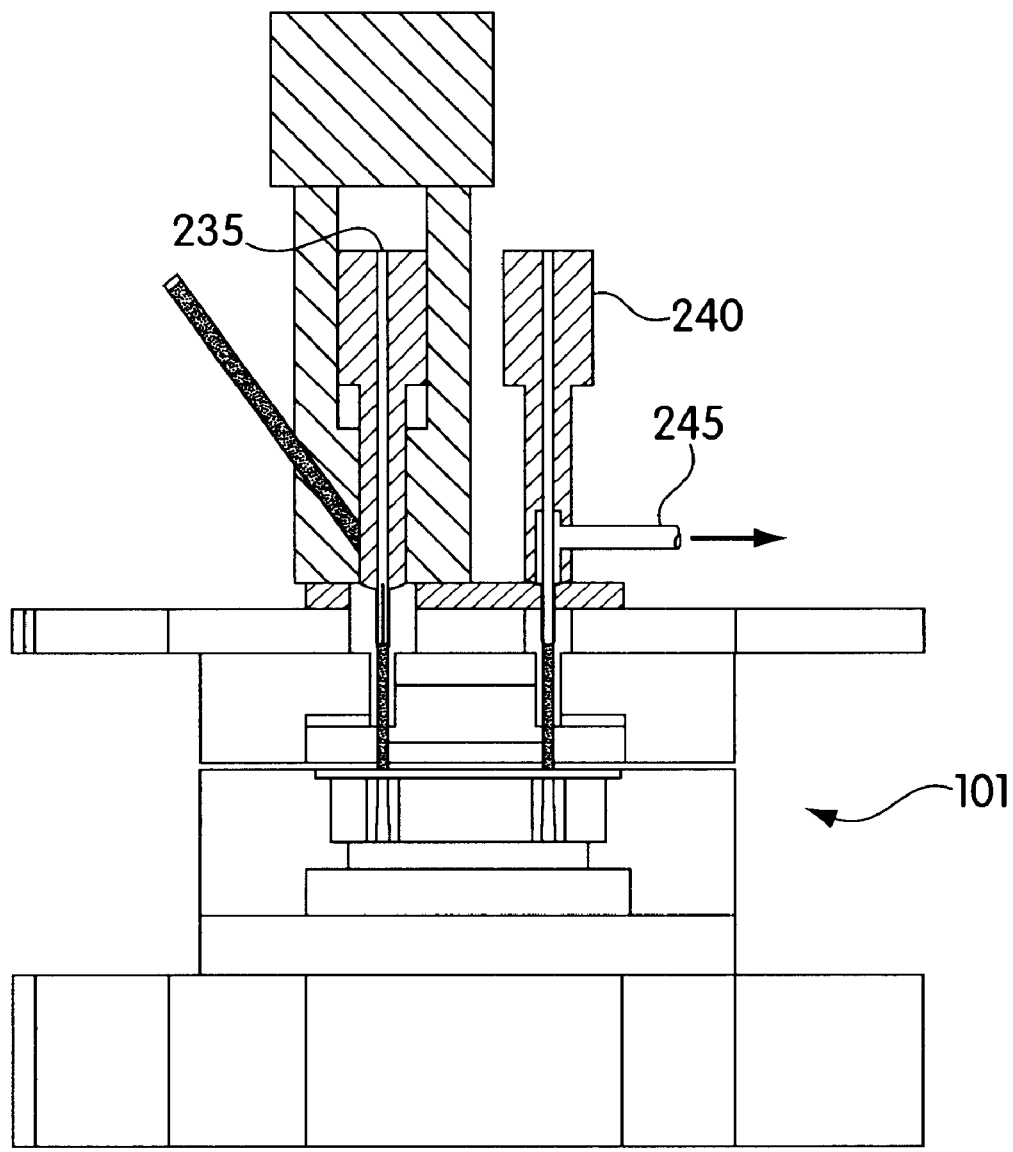

FIG. 31 illustrates the system and process of FIG. 28 after the underfill process is complete. Upon completion of the underfill, the shut-off valve 240 and the vent/vacuum valve 245 close. Closing both the shut-off valve 240 and the vent/vacuum valve 245 helps to prevent excess underfill material from getting into or dripping back on the component being underfilled. In addition, if the apparatus 101 also incorporates the use of a film 180 (as discussed in FIGS. 11–26), the film 180 also helps to reduce contamination by the underfill material. Also, the injection piston 235 retracts, in preparation for the next cycle.

Figure 32:
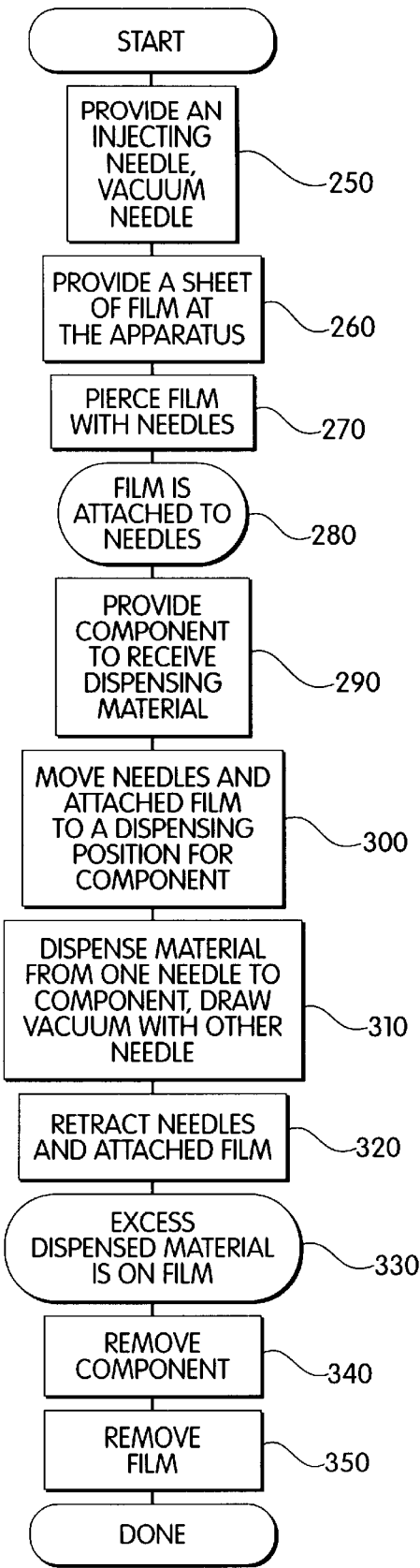
FIG. 32 is a flow chart of a process for dispensing material to a component, in accordance with one embodiment of the invention.

FIG. 32 is a flow chart of a process for dispensing material to a component, in accordance with an embodiment of the present invention. This process can be used, for example, as part of a process for underfilling flip chip devices. A pair of needles for injecting material (such as encapsulant used for underfilling a flip chip) (step 250) and a film (step 260) for protecting the apparatus and component are provided to accomplish this part of the process. For example, the needles can be provided in a first portion of the apparatus and the film can be provided in a second portion of the apparatus designed to mate to the first portion.

A sheet of film is provided at the apparatus (step 260). As described previously in connection with FIGS. 11–31, the film can be part of a continuous sheet of film, can be provided individually, or can already be part of the component being underfilled. If the film is already part of the component being underfilled, the process then skips to step 290. If the film already has openings in it for the needles, the process also skips to step 290. If, however, the film is provided separately from the component, the process proceeds to step 270. The needles pierce the film (step 270) to create openings in the film by which one of the needles can inject underfill material and the other needle can draw a vacuum on the component being underfilled, to draw the underfill material through the appropriate areas of the component.

The piercing of the film by the needles in step 270 can be accomplished in several different ways, in accordance with the present invention. In one embodiment of the present invention, the first and second portions of the apparatus can be brought together so that the needle contacts, pierces, and projects through the film. In other embodiments, piercing can be accomplished by keeping the film in a fixed position and moving the needles towards it, by keeping the needles in a fixed position and moving the film towards it, or by moving the needles and the film towards each other. Those skilled in the art will appreciate that any method by which the apparatus, needles, and film are positioned to cause the needles to pierce the film is usable in accordance with the invention.

After piercing, the needles and film will be attached to each other (step 280). Thus, if the needles are moved, the film will move with the needles. The film and needles remain attached until either (or all) are intentionally removed from the other. In the embodiment of the invention associated with FIG. 32, the needles and attached film are moved to a dispensing position relative to the component that is to receive the dispensing material (steps 290 and 300). Those skilled in the art will appreciate that the component can also be moved towards the needle and attached film, or that component and needle with attached film can be moved towards each other simultaneously, as long as the needle can achieve a proper position for dispensing material to (or around, or underneath, as applicable) the component.

After a component is provided to the apparatus for underfilling (step 290), the needles are moved to a dispensing position for dispensing the underfill material to the component (step 300). In embodiments where the component already has film attached to it or where the film already has openings in it, step 300 includes positioning the needles so that the needles either can pierce the film or can be inserted into openings already formed on the film. One of the needles is used to provide material to be dispensed, such as material to be dispensed around (or underfilled around) a component. The other needle is used to draw a vacuum on the component, to draw the underfill material through the component.

When the needles are in a proper dispense position, material is dispensed to the component and a vacuum is drawn on the component with the other needle (step 310), in a manner similar to that described in FIGS. 1–10. After dispensing is complete, if the component includes film that is attached to the component, the process skips to step 330. After dispensing is complete, if the component includes film that is not attached to the component, the process moves to step 320, and the needle and attached film are moved away from the component (step 320). Because the film was disposed around one of the needles when the needle dispensed material, and was drawn towards the other needle when that needle drew a vacuum on the component, excess underfill material can stick or cling to the film, instead of contaminating the apparatus or the areas of the component that were not supposed to receive the material (step 330).

The component can then be removed (step 340), and the film (which may have some material on it) can be removed (step 350), such as by physically removing the film from the needle, removing the needle from the film so that the film can be rolled away or torn off, or removing the film from the component (if the film was attached to the component prior to underfilling). In another embodiment, the film might be cleaned instead of being removed entirely. It should also be understood that steps 340 and 350 could be reversed, as desired. When the component is removed and the contaminated film is removed or cleaned, the apparatus will be ready to receive a new component for processing.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. An apparatus for adding encapsulant material to a component attached to a substrate, comprising:

an injector having an injecting outlet with an injecting tip through which encapsulant material is injected to a process area on the substrate and an air inlet with an inlet tip through which air is drawn from a process area on the substrate;

a fixture in communication with the injecting outlet and the air inlet, the fixture including a receptacle for receiving the substrate and a gasket capable of forming a seal around at least a portion of the injecting outlet and vacuum outlet; and a sheet of substantially taut film disposed between the injector and a substrate placed in the receptacle of the fixture, such that, when the injector is in a position for dispensing encapsulant to the process area on the substrate, at least the injecting tip and the inlet tip of the injector project through the substantially taut film to the process area.

2. The apparatus of claim 1 wherein the apparatus further comprises a pressure pad structured and arranged to pull the sheet of film substantially taut when the film is disposed adjacent the pressure pad.

3. The apparatus of claim 1, wherein the sheet of substantially taut film is disposed on a surface of the substrate.

4. The apparatus of claim 1 wherein the injecting tip and inlet tip are constructed and arranged to retract through the substantially taut film when dispensing of the encapsulant is complete.

5. The apparatus of claim 1 further comprising a film moving member for disposing the film between the injector and the receptacle.

6. The apparatus of claim 5 wherein the film moving member removes the film from its location between the injector and the substrate after encapsulant material has been dispensed.

7. The apparatus of claim 6 wherein the film moving member comprises a roller system that rolls the film away from the substrate after encapsulant material has been dispensed.

8. The apparatus of claim 4 further comprising a film moving member for disposing the film between the injector and the receptacle.

9. The apparatus of claim 8 wherein the film moving member comprises a roller system that rolls the film away from the substrate after the injecting tip and inlet tip have been retracted.

10. An apparatus for adding encapsulant material to a component attached to a substrate, the substrate having a sheet of film covering a process area on the substrate, comprising:

an injector having an injecting outlet with an injecting tip through which encapsulant material is injected to a process area on the substrate and an air inlet with an inlet tip through which air is drawn from a process area on the substrate;

a fixture in communication with the injecting outlet and the air inlet, the fixture including a receptacle for receiving the substrate and a gasket capable of forming a seal around at least a portion of the injecting outlet and vacuum outlet, the fixture structured and arranged so that when the injector is in a position for dispensing encapsulant to the process area on the substrate, at least the injecting tip and the inlet tip of the injector project through the film on the substrate to the process area.

11. The apparatus of claim 10, wherein the injecting tip and inlet tip are constructed and arranged to retract through the film when dispensing of the encapsulant is complete.

12. An apparatus for adding encapsulant material to a component attached to a substrate, comprising:

a means for injecting encapsulant material to a process area on the substrate, the injecting means including an outlet for dispensing encapsulant material to a process area on the substrate and an inlet for drawing air from a process area on the substrate;

a means for holding the substrate while encapsulant material is added, the holding means in communication with the injecting means;

a means for sealing forming a seal around at least a portion of the outlet and inlet of the injecting means; and a means for forming a barrier between the holding means and the injecting means, the barrier means preventing encapsulant material from contaminating the receiving means and areas of the substrate outside of the process area and permitting the outlet and the inlet to access the process area of the substrate.

13. The apparatus of claim 12 wherein the apparatus further comprises a means for applying pressure to the barrier means so that the barrier is substantially taut when the barrier means is disposed adjacent the pressure means.

14. The apparatus of claim 12 wherein the barrier means is disposed on a surface of the substrate.

15. The apparatus of claim 12 wherein the inlet and outlet are constructed and arranged to pass through the barrier means for dispensing encapsulant and pass back through the barrier means when dispensing of the encapsulant is complete.

16. The apparatus of claim 13 further comprising a barrier moving means for moving the barrier means to and from a position between the injecting means and the holding means.

17. The apparatus of claim 16 wherein the barrier moving means removes the barrier means from its location between the injecting means and the substrate after encapsulant material has been dispensed.

18. The apparatus of claim 17 wherein the barrier means comprises a flexible barrier means and the barrier moving means comprises a roller means for rolling the flexible barrier means away from the substrate after encapsulant material has been dispensed.

19. The apparatus of claim 15 further comprising a barrier moving means for moving the barrier means to and from a position between the injecting means and the holding means.

20. The apparatus of claim 19 wherein the barrier means comprises a flexible barrier means and the barrier moving means comprises a roller means for rolling the flexible barrier means away from the substrate after the injecting means and inlet means pass back through the barrier means.

21. An apparatus for adding encapsulant material to a component attached to a substrate, the substrate having a sheet of film covering a process area on the substrate, comprising:

a means for injecting comprising an outlet through which encapsulant material is dispensed to a process area on the substrate and an inlet through which air is drawn from a process area on the substrate;

a means for holding in communication with the outlet and inlet of the injecting means, the holding means holding the substrate while encapsulant material is added and permitting the inlet and outlet of the process means to pass through the film disposed on the substrate to the process area; and a means for sealing disposed between the injecting means and the holding means, the sealing means forming a seal around at least a portion of the outlet and inlet of the injector means.

22. The apparatus of claim 11, wherein the outlet and inlet pass back through the film when dispensing of the encapsulant is complete.

* * * * *